(12) United States Patent
Fillion et al.

(10) Patent No.: US 6,239,980 B1
(45) Date of Patent: May 29, 2001

(54) MULTIMODULE INTERCONNECT STRUCTURE AND PROCESS

(75) Inventors: Raymond Albert Fillion, Niskayuna, NY (US); Wolfgang Daum, Louisville, KY (US); Ronald Frank Kolc, Cherry Hill, NJ (US); Donald William Kuk, Albany; Rob Ert John Wojnarowski, Ballston Lake, both of NY (US)

(73) Assignee: General Electric Company, Schenectady NY ( * ) Notice: Subject to any disclaimer, the term of this patent is extended or adjusted under 35 U.S.C. 154(b) by 0 days.

(21) Appl. No.: 09/144,486

(22) Filed: Aug. 31, 1998

(51) Int. Cl.[7] ................................................. H05K 1/14
(52) U.S. Cl. .................... 361/760; 361/761; 361/748; 361/749; 361/728; 361/729; 174/250; 174/255; 174/260; 174/262; 174/266; 257/700; 257/723; 257/724; 29/827; 29/830; 29/840
(58) Field of Search ........................... 361/760, 729, 361/771, 783, 736, 748, 749, 761, 728; 257/723, 724, 792, 793, 795, 700; 174/250, 254, 255, 256, 259, 260, 262, 266; 29/830, 840, 827

(56) References Cited

U.S. PATENT DOCUMENTS

| | | | |
|---|---|---|---|
| 4,714,516 | 12/1987 | Eichelberger et al. | 156/628 |
| 4,764,485 | 8/1988 | Loughran et al. | 437/225 |
| 4,780,177 | 10/1988 | Wojnarowski et al. | 156/643 |
| 4,783,695 | 11/1988 | Eichelberger et al. | 357/65 |
| 4,835,704 | 5/1989 | Eichelberger et al. | 364/490 |
| 4,842,677 | 6/1989 | Wojnarowski et al. | 156/643 |
| 4,878,991 | 11/1989 | Eichelberger et al. | 156/630 |
| 4,884,122 | 11/1989 | Eichelberger et al. | 357/71 |
| 4,894,115 | 1/1990 | Eichelberger et al. | 156/643 |
| 5,081,563 | * 1/1992 | Feng et al. | 361/795 |
| 5,147,210 | * 9/1992 | Patterson et al. | 439/91 |
| 5,154,793 | 10/1992 | Wojnarowski et al. | 156/344 |
| 5,241,456 | * 8/1993 | Marcinkiewicz et al. | 361/792 |
| 5,286,417 | * 2/1994 | Mahmoud et al. | 252/518 |
| 5,315,486 | * 5/1994 | Fillion et al. | 361/795 |
| 5,338,975 | * 8/1994 | Cole, Jr. et al. | 257/750 |
| 5,353,195 | 10/1994 | Fillion et al. | 29/840 |
| 5,353,498 | 10/1994 | Fillion et al. | 29/840 |
| 5,371,654 | * 12/1994 | Beaman et al. | 361/744 |
| 5,497,033 | 3/1996 | Fillion et al. | 257/723 |
| 5,527,741 | 6/1996 | Cole et al. | 437/209 |
| 5,568,356 | * 10/1996 | Schwartz | 361/679 |
| 5,609,889 | * 3/1997 | Weber | 425/116 |
| 5,731,073 | 3/1998 | Knott et al. | 428/304.4 |
| 5,875,100 | * 2/1999 | Yamashita | 361/764 |
| 6,025,995 | * 2/2000 | Marcinkiewicz | 361/760 |
| 6,060,772 | * 5/2000 | Sugawara et al. | 257/678 |

* cited by examiner

*Primary Examiner*—Jeffrey Gaffin
*Assistant Examiner*—David Foster

(57) ABSTRACT

A circuit design is logically partitioned into a plurality of blocks. As a first hierarchial assembly level, the blocks are fabricated as individual submodules each including at least one electronic component with component connection pads on a top surface, and a first interconnect structure including at least one interconnect layer bonded to the top surfaces, and interconnecting selected ones of the component connection pads. Submodule connection pads are provided on upper surfaces of the submodules. As a second hierarchial assembly level, a second interconnect structure is bonded to the upper surfaces and interconnects selected ones of the submodule connection pads.

41 Claims, 19 Drawing Sheets

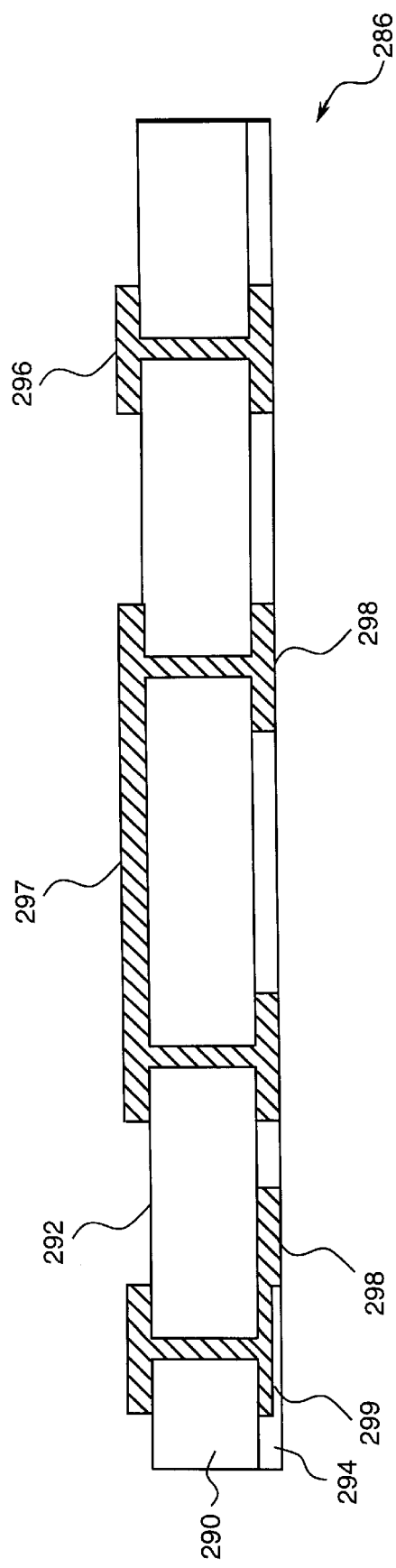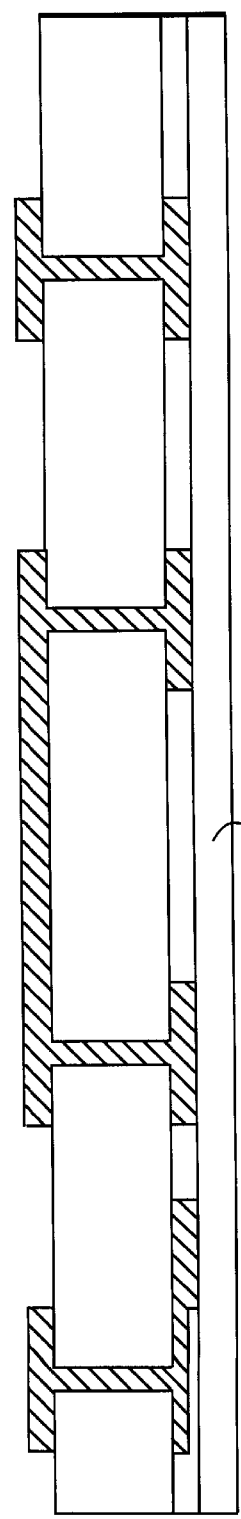

MULTIMODULE INTERCONNECT STRUCTURE AND PROCESS

BACKGROUND OF THE INVENTION

This invention relates generally to complex multichip modules (MCMs) and, more particularly, to complex MCMs which can cost-effectively be assembled with high yields, as well as to corresponding methods of manufacture.

As disclosed in Eichelberger et al U.S. Pat. No. 4,783,695, and subsequent related patents, some of which are referred to herein below, high density interconnect (HDI) technology has quite successfully been employed to interconnect large numbers of complex semiconductor devices to make multichip modules, with improved electrical, thermal, and mechanical performance characteristics, compared to various other single chip and multichip packaging approaches. Very briefly, HDI MCMs include a plurality of semiconductor integrated circuit chips and other electronic components mounted on a substrate. The chips and other electronic components are interconnected by a multilayer interconnect structure including interleaved layers of thin film polymer dielectric material (e.g. KAPTON® polyimide—KAPTON is a trademark of Dupont Co.) and patterned metallization, with vias formed in the polymer layers.

A broad spectrum of modules have been successfully fabricated using this HDI technology. These include high chip count modules (including 40 to 50 chips), high pin count modules (with 400 I/O lines), high speed digital modules (200 MHz on Si, and 2 Ghz on GaAs), mixed analog and digital modules (e.g. 44 channel A/D conversion modules), power conversion modules (e.g. 50V to 5V DC to DC), microwave modules (S, C, Ku and X-band) and millimeter wave modules (44 Ghz).

More particularly, the previously-disclosed HDI structure employs a ceramic substrate, made of alumina, for example, with a thickness between 25 and 100 mils. The substrate is of appropriate size and strength for the overall electronic system in which it is utilized. This size is typically on the order of two inches square.

Individual cavities, or one large cavity, having appropriate depths at the intended locations of the various chips, are prepared. This may be done by starting with a bare substrate having a uniform thickness and the desired size. Conventional, laser or ultrasonic milling is used to form the cavities in which the various chips and other components are subsequently positioned. For systems where it is desired to place chips of uniform size edge-to-edge, a single large cavity may be satisfactory.

The various components are placed in their desired locations within the cavities and adhered by means of a thermoplastic adhesive layer, preferably ULTEM® polyetherimide resin (ULTEM is a trademark of General Electric Co.). More particularly, the entire structure is heated to the softening point of the ULTEM polyetherimide (in the vicinity of 217° C. to 235° C. depending on the formulation used) and then cooled to thermoplastically bond the individual components to the substrate. At this stage, the upper surfaces of all components and the substrate are disposed in a substantially common plane.

The multilayer interconnect overcoat structure is then built up to electrically interconnect the components into an actual functioning system. To begin the HDI overcoat structure, a polyimide dielectric film, which may be KAPTON® polyimide, about 0.0005 to 0.003 inch (12.5 to 75 microns) thick is pretreated to promote adhesion and coated on one side with ULTEM polyetherimide resin or another thermoplastic and laminated across the top of the chips, other components and the substrate, with the ULTEM resin serving as a thermoplastic adhesive to hold the KAPTON film in place.

The actual as-placed locations of the various components and contact pads thereon are determined, and via holes are adaptively laser drilled in the KAPTON film and ULTEM adhesive layers in alignment with the contact pads on the electronic components. Exemplary laser drilling techniques are disclosed in Eichelberger et al U.S. Pat. Nos. 4,714,516 and 4,894,115; and in Loughran et al U.S. Pat. No. 4,764,485.

A metallization layer is deposited over the KAPTON film layer and extends into the via holes to make electrical contact to the contact pads disposed thereunder. This metallization layer may be patterned to form individual conductors during the process of depositing it, or may be deposited as a continuous layer and then patterned using photoresist and etching. The photoresist is preferably exposed using a laser which is scanned relative to the substrate to provide an accurately aligned conductor pattern at the end of the process. Exemplary techniques for patterning the metallization layer are disclosed in Wojnarowski et al U.S. Pat. Nos. 4,780,177 and 4,842,677; and in Eichelberger et al U.S. Pat. No. 4,835,704 which discloses an "Adaptive Lithography System to Provide High Density Interconnect." Any misposition of the individual electric components and their contact pads can be compensated for by and adaptive laser lithography system as disclosed in U.S. Pat. No. 4,835,704.

Additional dielectric and metallization layers are provided as required in order to make all of the desired electrical connections among the chips.

Yield and cost considerations have been important factors in the fabrication of such HDI modules. Thus, due in part to the varying die yields of the individual semiconductor die, initial module yields following initial assembly, which may be viewed as the first pass, range from 25% to 90%. With the implementation of module rework and repair, final module yields were improved to 80% to 100%.

An HDI module can be disassembled for repair or replacement of a faulty component and then reassembled without significant risk to the good components incorporated within the system. Repairability is particularly important where fifty or more chips having a cost of as much as $2,000.00, each, may be incorporated in a single system on one substrate. Techniques for testing and repairing HDI MCMs are disclosed in Eichelberger et al U.S. Pat. Nos. 4,878,991, 4,884,112 and 4,937,203; and in Wojnarowski et al U.S. Pat. No. 5,154,793.

One key element to the repair of a failing HDI MCM as disclosed in those patents is that the adhesive which attaches the first layer of the overlay to the components, and the adhesive which attaches the components to the substrate, are both thermoplastic polymers that soften and release when exposed to an elevated temperature. Another key to the disclosed rework process is that the adhesive which attaches the overlay softens at a lower temperature than the adhesive which attaches the die or other components. Thus, by raising a defective module to a temperature above the overlay adhesive softening temperature, but below the die attach adhesive softening temperature, the overlay structure can be removed from the substrate without disturbing the chips below. To subsequently remove a chip, localized heat is applied to the selected chip raising the temperature of the chip above the softening temperature of the die attach adhesive, and permitting chip removal by a number of manual methods.

The module is then repaired by adhesive clean up, reapplication of a die adhesive, placement of the replacement die and curing of the die attach adhesive. This is followed by repeating all of the overlay thin film processing steps.

A subsequent technology, known as COF (Chip On Flex) was developed to reduce the complexity and cost of the HDI process, in two respects.

In overview, a first aspect of the COF technology, as disclosed in Fillion et al U.S. Pat. Nos. 5,353,498 and 5,497,033, is that the HDI ceramic substrate milling process is eliminated by employing a molding process. Thus, the die top surfaces (which support component connection pads) are bonded to a polymer stretched film, employing a thermoplastic or thermoset adhesive, and then a polymeric molding material, such as an epoxy-based molding compound, is employed to encapsulate all remaining surfaces of the chips and other electronic components. The chips and other electronic components are thus encapsulated within a body of hardened epoxy-based molding compound, which forms the substrate.

In overview, a second aspect of the COF technology, as discussed in Fillion et al U.S. Pat. No. 5,353,195 with respect to power and to signal connections, is that a polymer dielectric stretched film which is pre-patterned on either or both sides is used to provide two interconnect layers that do not require the relatively expensive HDI thin film processing steps summarized hereinabove.

The overlay structure is then completed employing the previously-disclosed HDI thin film processing techniques, using a laser to form via holes, and forming a third patterned metallization layer, including connections through the vias to the component connection pads.

More particularly, as the COF process is generally implemented, a polymer film structure comprises a polyimide film of uniform thickness, which may be within the range of 10 to 100 microns, having a pattern of metallization on the top surface, bottom surface, or both surfaces. Typical metallization thickness is within the range of 1 to 200 microns, and the metallization comprises Cu or Al, and a barrier layer metal such as Ti or Cr. A polymer adhesive is coated over either selected areas of or the entire surface of the bottom side of the polymer film structure. The polymer adhesive may be a thermoset or a thermoplastic material.

At least one component is mounted to the bottom side of the polymer film structure, with a top (active) surface of the component (or components) in contact with the polymer adhesive and mechanically bonded to the polymer film structure by the adhesive. The component is then encapsulated along its bottom and side surfaces within a body of plastic molding compound that also covers at least a portion of the adhesive-coated bottom side of the polymer film structure. The molding compound is a thermoset polymer, such as a epoxy with low CTE (coefficient of thermal expansion) particles mixed within it.

Vias are then formed through the polymer film, aligned with respective component contact pads on the top surface of the component. In addition, at least one via extends through the polymer film to the metallization on the bottom surface of the polymer film structure. Vias may be formed by laser ablation, plasma etching, chemical etching, mechanical milling, or by a combination of these methods. Finally, an upper metallization layer is formed and patterned, extending through the vias to electrically contact the component contact pads and the metallization on the bottom surface of the polymer film structure, and to leave contact pads on the top surface.

The resultant structure can have three layers of interconnection, but advantageously only one of these layers requires the HDI thin film processing steps at the time of assembly. A disadvantage however is that the encapsulated molding step makes reworking or repair of a COF module that happen to have a defective die difficult and costly, or even impossible.

The COF technology accordingly is particularly applicable to simple high-yielding few-chip modules. The COF technology, despite its cost advantages, is not as useful with more complex MCMs in view of yield issues.

SUMMARY OF THE INVENTION

It is therefore seen to be desirable to cost effectively fabricate complex MCMs with high-yield, and to employ COF technology in the fabrication of complex MCMs.

In an exemplary embodiment of the invention, a plurality of MCM building block submodules (or one or more MCM building block submodules, and one or more single chip components) are assembled into a more complex module, after individually testing the building block submodules. A method of fabricating a complex multi-component module begins with the step of logically partitioning a circuit design into a plurality of blocks. Each block includes at least one electronic component.

As a first hierarchial assembly level, the blocks are fabricated as individual submodules. Each submodule includes at least one electronic component with component connection pads thereon, and which may be supported on a submodule substrate. A first interconnect structure is provided overlying and bonded to the electronic components, interconnecting selected ones of the component connection pads. The first interconnect structure may be a multilayer interconnect structure including interleaved layers of dielectric material and conductive material. Submodule connection pads are included on an upper surface of the first interconnect structure.

As a second hierarchial assembly level, the submodules are interconnected in much the same manner as the individual components during the first assembly level. Thus a second interconnect structure is provided overlying and bonded to the upper surfaces of the submodules, interconnecting selected ones of the submodule connection pads. The second interconnect structure likewise may be a multilayer interconnect structure including interleaved layers of dielectric material and conductive material such as metallization.

BRIEF DESCRIPTION OF THE DRAWINGS

FIGS. 13 through 17 depict a process flow for the second hierarchial assembly level, using anisotropically conductive adhesive;

DETAILED DESCRIPTION OF THE INVENTION

The invention is particularly applicable to the fabrication of complex multichip modules employing a modification of the previously-disclosed HDI process briefly discussed hereinabove. The invention may be embodied in MCMs including many individual semiconductor chips and fabricated with high yield.

As a preliminary design step, a complex circuit with a large number of complex semiconductor components and passive support components is divided into a number of logic blocks. Each logic block contains one or more components, typically from two to ten or more components per logic block. The partitioning of the circuit into logic blocks is based on a number of factors including, but not limited to the number of interconnections within a logic block, the number of connections external to each logic block, the complexity and I/O count of each of the components included in a logic block, the estimated yield loss of each component, the power dissipation of each component, and the function and other characteristics of each component, for example, logic vs. RAM, signal vs. logic, high power vs. low power, and digital vs. RF.

Figure 1:
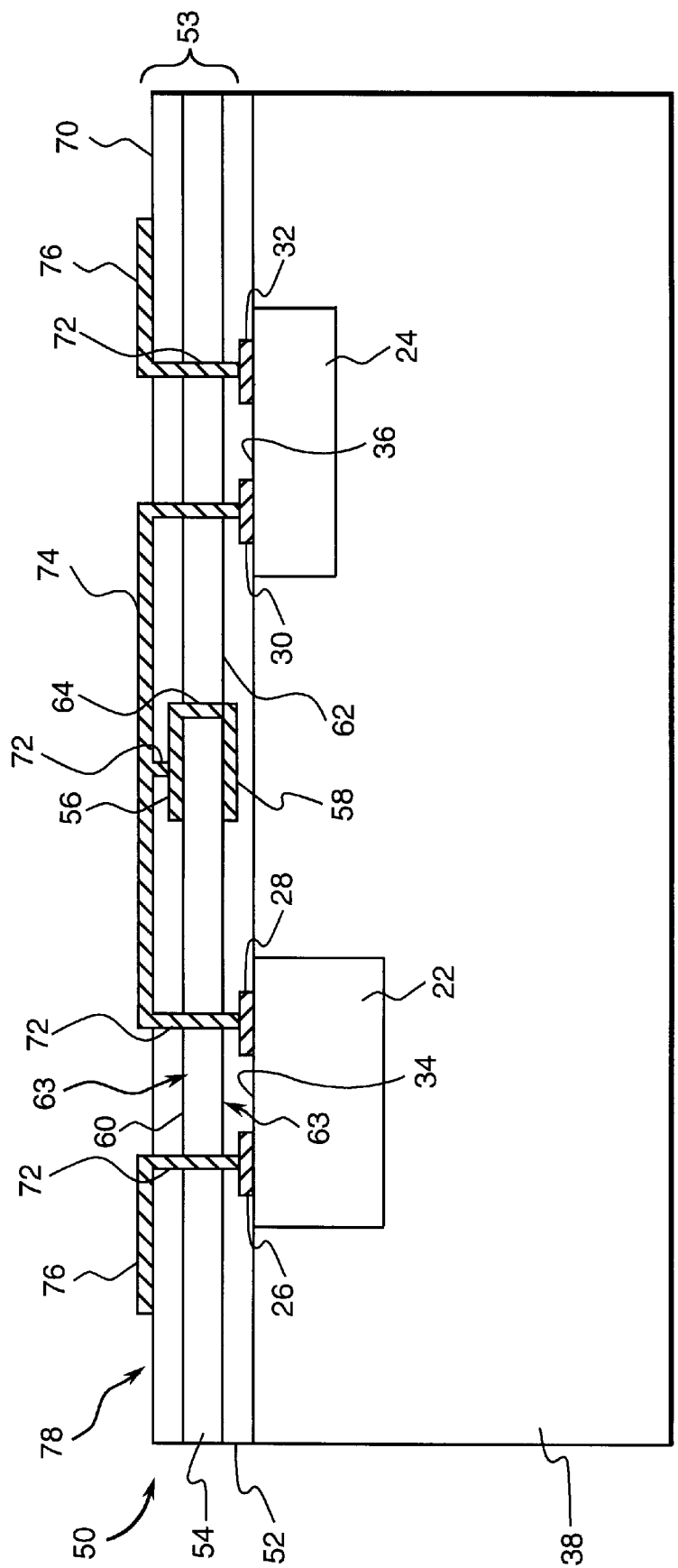
FIG. 1 is a sectional side view of a representative submodule including two representative electronic components supported on a substrate and interconnected by a first multilayer interconnect structure corresponding to a first level of assembly.

FIG. 1 depicts a representative submodule 20 corresponding to a logic block. Submodule 20 includes representative electronic components 22 and 24, such as semiconductor die or "chips" or passive components which have representative component connection pads 26, 28, 30 and 32 on the top or active major surfaces 34 and 36 thereof.

Components 22 and 24 are supported on a submodule substrate 38, which may be a ceramic substrate with cavities milled therein with components 22 and 24 attached by glue as in the originally-disclosed HDI technology or, preferably, a molded substrate 38 such as is disclosed in Fillion et al U.S. Pat. Nos. 5,353,195, 5,353,498 and 5,497,033.

Interconnecting component connection pads 26, 28, 30 and 32 is a first interconnect structure 50, which in FIG. 1 is a multilayer interconnect structure 50, overlying components 22 and 24 as well as substrate 38, and bonded thereto by means of an adhesive layer 52.

Multilayer interconnect structure 50 in this example includes three patterned metallization layers and may, for example, be fabricated employing previously disclosed HDI fabrication techniques summarized above.

Preferably however, multilayer interconnect structure 50 comprises a prefabricated flexible interconnect structure 53 including a first dielectric film layer 54 that is pre-patterned with metallization 56 and 58 on a connection-facing surface 60 and on a substrate-facing surface 62 respectively, as is disclosed in Cole et al U.S. Pat. No. 5,527,741, and as summarized hereinabove in the context of the COF process. There are openings 63 which form surfaces of first dielectric film layer 54 that are not covered by metallization layers 56 and 58. Openings 63 correspond corresponding to component connection pads 26, 28, 30 and 32. Accordingly component connection pads 26, 28, 30 and 32 are not in direct electrical contact with patterned metallization plane 58 on substrate-facing surface 62 at the time of assembly, and vias are subsequently formed to access component interconnection pads 26, 28, 30 and 32. A representative via 64 interconnects portions of metallization planes 56 and 58.

The use of pre-patterned dielectric film layer 54 to provide two metallization planes is less expensive than fabricating two thin film interconnect layers as in the originally-disclosed HDI fabrication process.

Overlying connection-facing surface 60 and patterned metallization 56 thereon is a first dielectric cap layer 70 which acts as an electrical insulation layer between top metallization plane 56 and subsequently added patterned metallization layer 74 and connection pads 76. Dielectric cap layer 70 may either be included as part of prefabricated flexible interconnect structure 53, or be added later. A first plurality of vias 72, formed by adaptive laser ablation extends through dielectric cap layer 70, and through at least portions of first dielectric film layer 54 in alignment with respective ones of component connection pads 26, 28, 30 and 32, as well as with predetermined portions of at least one of the patterned metallization planes 56 and 58. A patterned metallization layer 74 is formed on dielectric cap layer 70 and within vias 72 to complete the interconnection structure. In addition, metallization 74 includes submodule connection pads 76 on first dielectric cap layer 70, and preferably test pads comparable to pads 76 to facilitate functional and performance testing of submodule 20. Patterned metallization layer 74, with submodule connection pads 76 and first dielectric cap layer 70 together define an upper surface 78 of submodule 20.

Multilayer interconnect structure 50 thus provides all of the internal connections within submodule 20, and provides connection pads 76 for all external block connections as well as test pads. To facilitate subsequent interconnect processing, external connection pads 76 are typically 5 to 10 mils (0.127 to 0.254 mm) square, larger than component connection pads 26, 28, 30 and 32 which typically are 2 to 40 mils (0.0508 to 0.1016 mm) square.

Even though interconnect structure 50 is depicted in FIG. 1 as a multilayer interconnect structure 50, simpler interconnect structures may be employed. For example, a single layer (i.e. single conductive layer) interconnect structure may be employed, including pre-patterned metallization 58 on substrate-facing surface 62, but omitting pre-patterned metallization 56 on connection-facing surface 60, as well as omitting dielectric cap layer 70. In this example, vias 72 are formed through dielectric film layer 54, and patterned metallization layer 74, including submodule connection pads 76, is formed directly on dielectric film layer 54.

Figure 2:
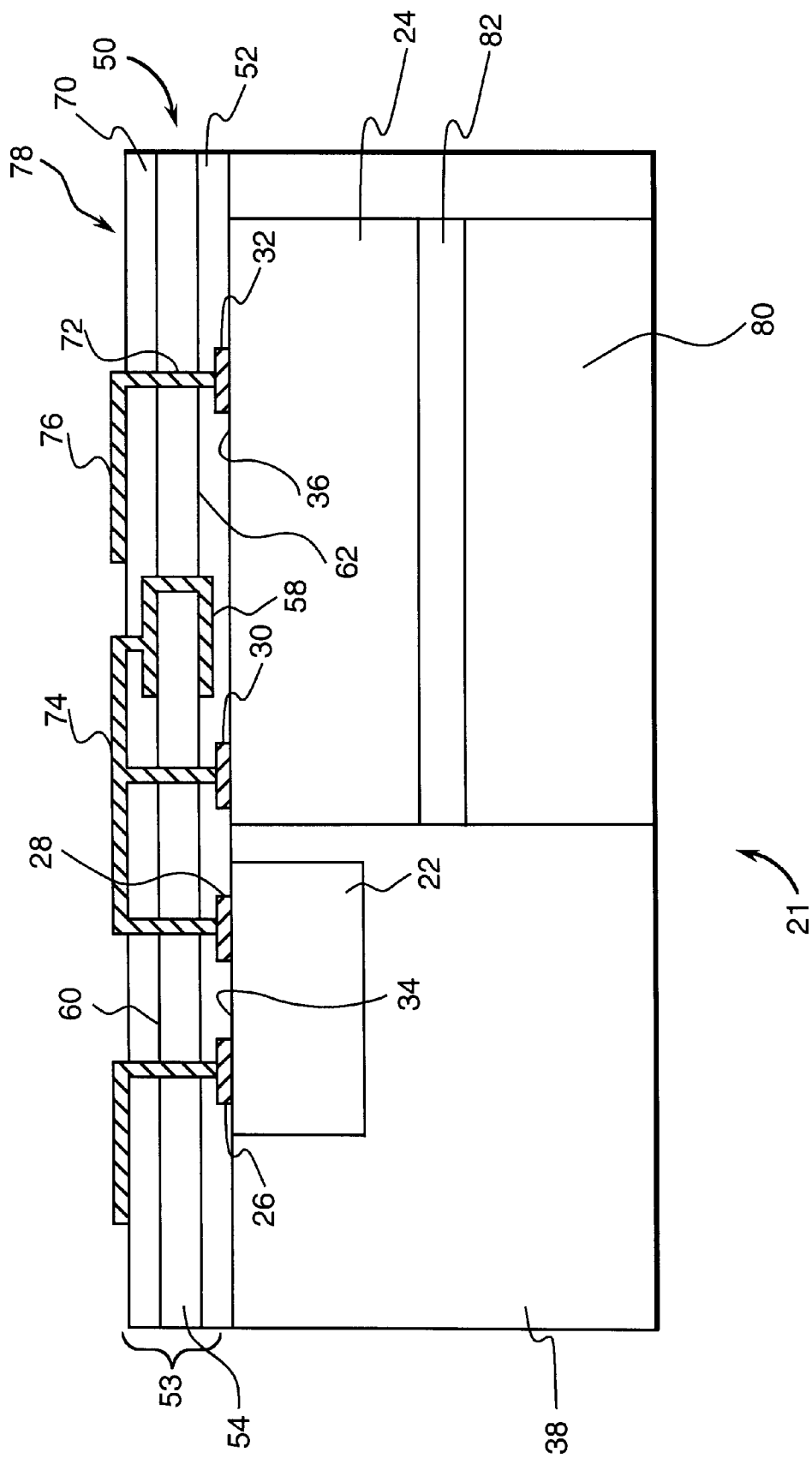
FIG. 2 is a sectional side view of another representative submodule including two representative electronic components supported on a substrate and interconnected by a first multilayer interconnect structure corresponding to a first level of assembly.

FIG. 2 illustrates a similar submodule 21, with corresponding elements designated by identical reference numerals.

Submodule 21 of FIG. 2 additionally includes an integral heat sink 80 for component 24, thermally connected by means of thermally conductive bonding material 82.

In many situations it is preferable that substrate 38 comprise hardened substrate molding material, formed as summarized above and as disclosed in Fillion et al U.S. Pat. Nos. 5,353,195, 5,353,498 and 5,497,033, by bonding top surfaces 34 and 36 of components 22 and 24 to prefabricated flexible interconnect structure 53, with component connection pads 26, 28, 30 and 32 thus facing interconnect structure 53, and then encapsulating the remaining surfaces of components 22 and 24 in a thermoset polymer molding compound, such as epoxy with low CTE particles mixed within it.

However, in other situations it is advantageous to employ a prefabricated substrate. This is of particular value in the case of components 22 and 24 that have electrical contacts on the back side that need to be accessed. Examples are some CMOS devices, GaAs RF devices, and power devices such as IGBTs, MOSFETs and MCTs.

Figure 3:
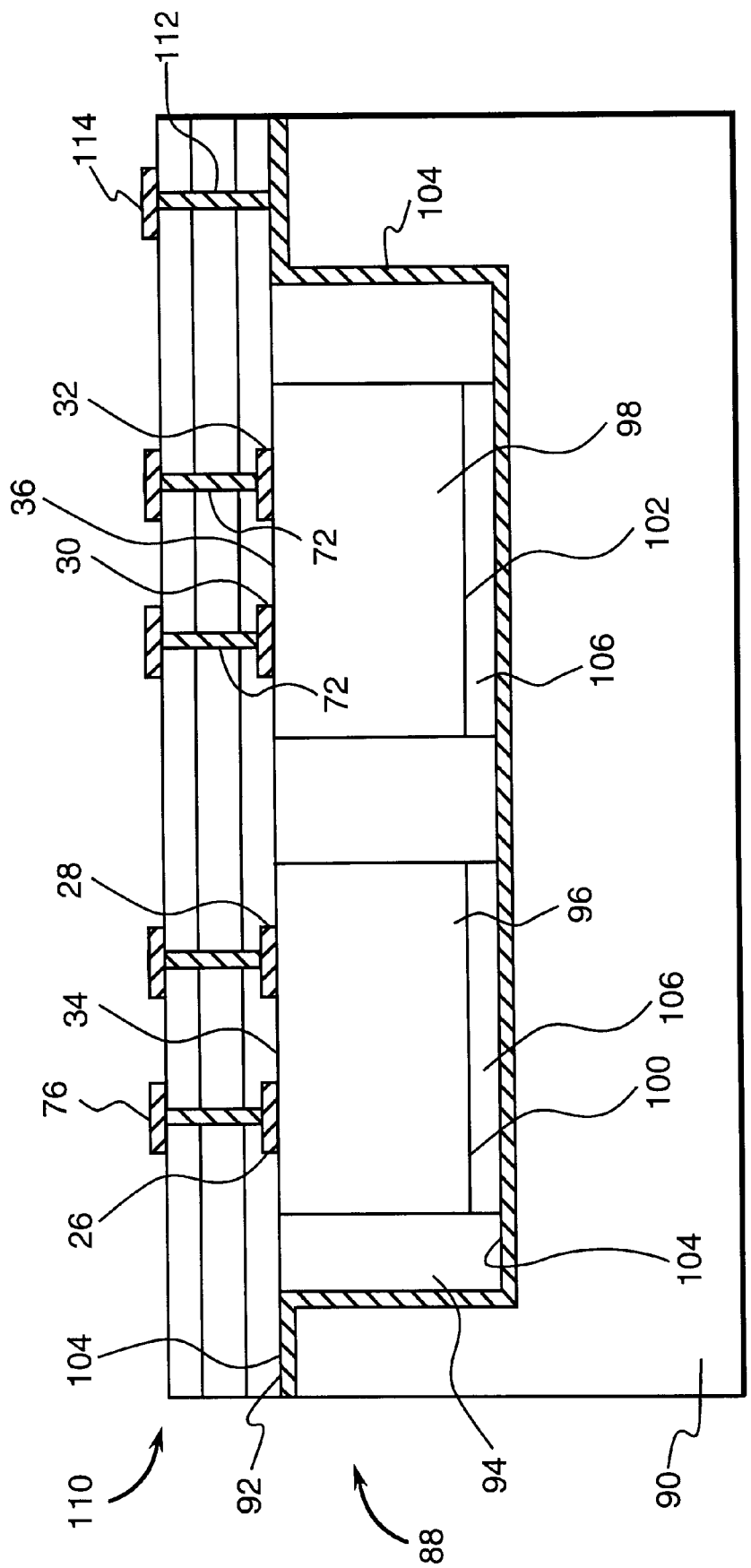
FIG. 3 is a sectional side view of a submodule employing a prefabricated substrate.

Thus, and referring to submodule 88 of FIG. 3, a preformed substrate 90 or body 90 has a substrate surface 92 and a cavity 94 with a depth corresponding to the thickness of representative components 96 and 98. Components 96 and 98 have respective back side electrical contacts 100 and 102, in addition to component connection pads 26, 28, 30 and 32 on top surfaces 34 and 36. Preformed substrate 90 is of the type previously employed in HDI structures and may comprise milled ceramic, milled metal, premolded metal, or a preformed plastic or composite structure, as examples.

Preformed substrate 90 preferably includes an electrically conductive layer 104 extending from the bottom of cavity 94 to substrate surface 92. Electrically conductive layer 94 may comprise a metal such as copper. During the fabrication process, components 96 and 98 are placed within cavity 94, and adhered employing electrically conductive material 106 such as solder or a polymer adhesive loaded with conductive particles to electrically connect back side electrical contacts 100 and 102 to electrically conductive layer 104.

An interconnect structure 110 is then formed over component top surfaces 34 and 36 and over substrate surface 92, such as a multilayer interconnect structure 110. Interconnect structure 110 may either employ a prefabricated (pre-patterned) flexible interconnect structure, or be fabricated and patterned layer-by-layer employing previously-disclosed HDI fabrication techniques. In addition to vias 72 making electrical connection to component connection pads 26, 28, 30 and 32, a via 112 is formed in alignment with electrically conductive layer 104 on substrate surface 92, terminating in a submodule connection pad 114. Thus, component back side electrical contacts 100 and 102 are electrically brought to connection pad 114 on the upper surface of the FIG. 3 submodule 88.

Figure 4:
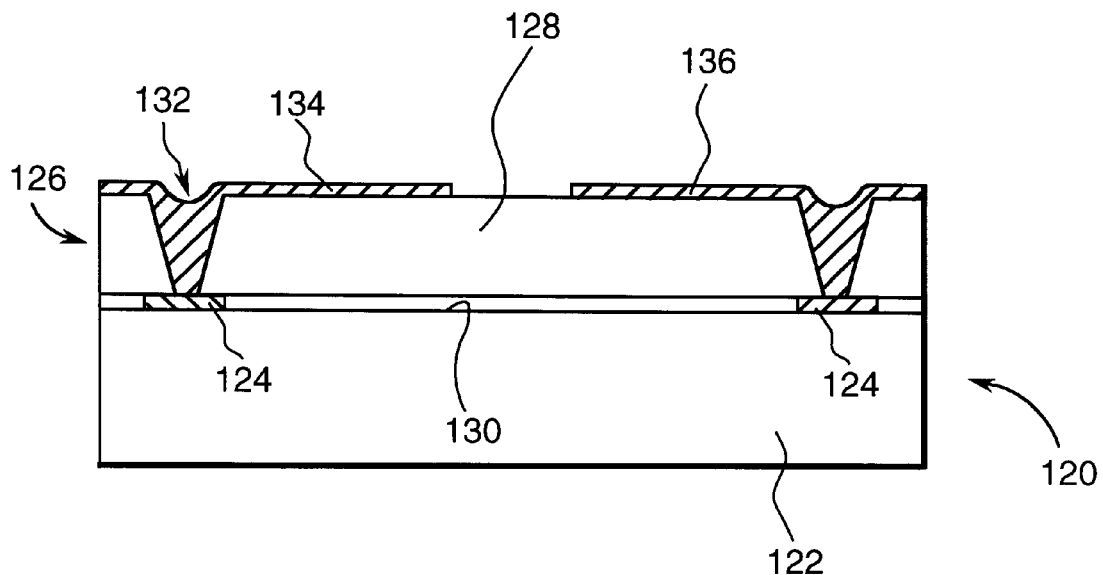
FIG. 4 is a sectional side view and FIG. 5 is a plan view of a submodule in the form of a single-chip COF package.
Figure 5:
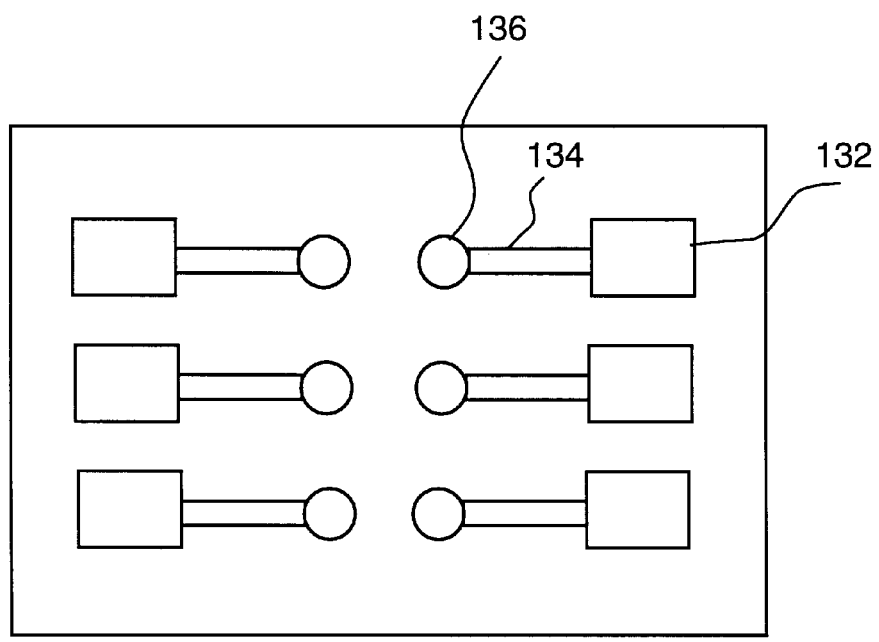

As another alternative, FIG. 4 is a sectional side view and FIG. 5 is a plan view of a submodule 120 comprising a single component 122 with component connection pads 124, and no substrate. A simple interconnect structure 126 includes a flexible dielectric film layer 128 adhered to top surface 130 of component 122. Vias 132 are formed through dielectric film layer 128 in alignment with component-connection pads 124. Patterned metallization 134, which includes submodule connection pads 136, extends through vias 132 in electrical contact with component connection pads 124.

Representative submodules 20 (FIG. 1), 21 (FIG. 2), 88 (FIG. 3) and 120 (FIG. 4), corresponding to logic blocks of the circuit being implemented, are subsequently treated and handled as large chip components, having connection pads 76 or 136. Submodules 20, 21, 88 and 120 can be tested, and optionally burned in, and discarded if not functioning or not within specified design requirements.

A second level design interconnects the submodules (building blocks) to create the full complex circuit, essentially using the same process and process alternatives, this time treating each submodule as a component.

Figure 6:
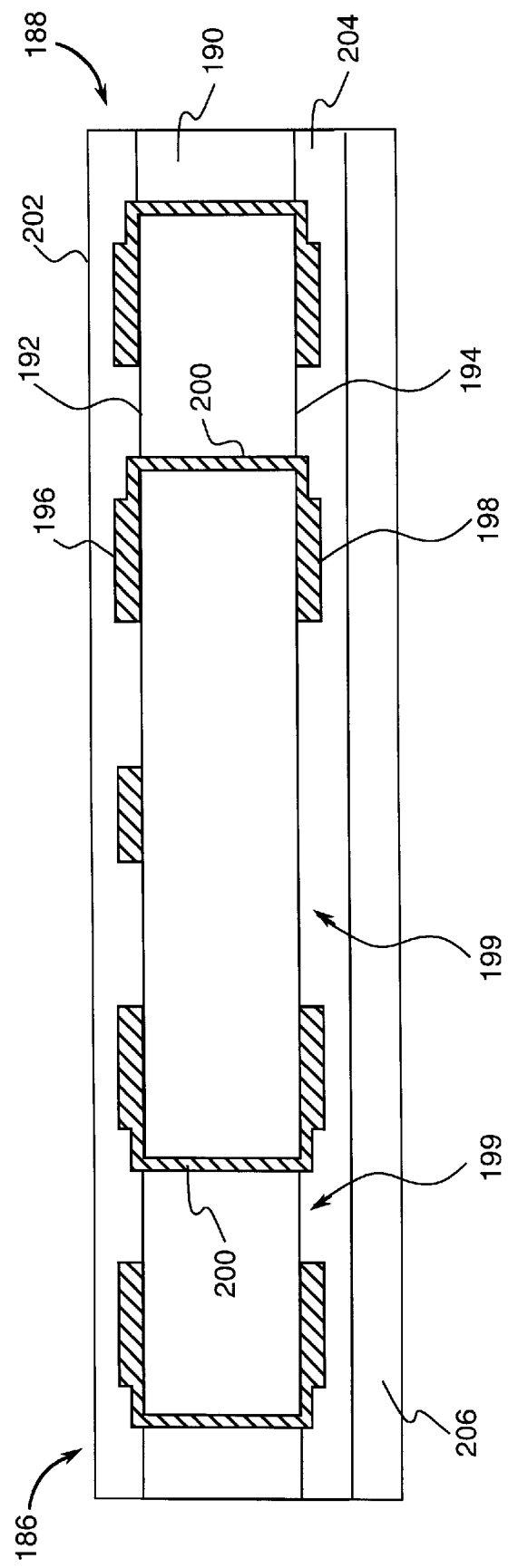
FIG. 6 is a sectional side view of a second dielectric film layer and related structure used to fabricate a second multilayer interconnect structure.

Thus, and with reference to FIG. 6, a second interconnect structure 186 comprises a prefabricated interconnect structure 188 including a dielectric film layer 190, comparable to first dielectric film layer 54, and comprising KAPTON® polyimide typically 10 to 100 microns in thickness. Dielectric film layer 190 has a connection-facing surface 192 and a submodule-facing surface 194, with respective patterned metallization planes 196 and 198 thereon. Openings 199 in metallization layers 196 and 198 correspond to the locations of submodule connection pads 76 in the final assembly. Accordingly, for the embodiments of FIGS. 6–8, submodule connection pads 76 are not in direct electrical contact with patterned metallization plane 198 on submodule-facing surface 194 at the time of assembly and vias are subsequently formed to access submodule interconnection pads. The prefabricated structure of FIG. 6 includes representative vias 200 interconnecting selected portions of metallization lanes 196 and 198.

A dielectric cap layer 202, is provided over connection-facing surface 192 as well as over patterned metallization plane 196 thereon. Dielectric cap layer 202 may either be part of a prefabricated flexible interconnect structure, or be added later.

Similarly, another dielectric layer 204 may be provided on submodule-facing surface 194, to protect patterned metallization plane 198. Finally, a layer 206 of adhesive is applied over dielectric layer 204 and over submodule-facing surface 194. It will be appreciated that optionally adhesive layer 206 may be applied to the upper surfaces of the FIG. 1 and FIG. 2 submodules 20 and 21.

Figure 7:
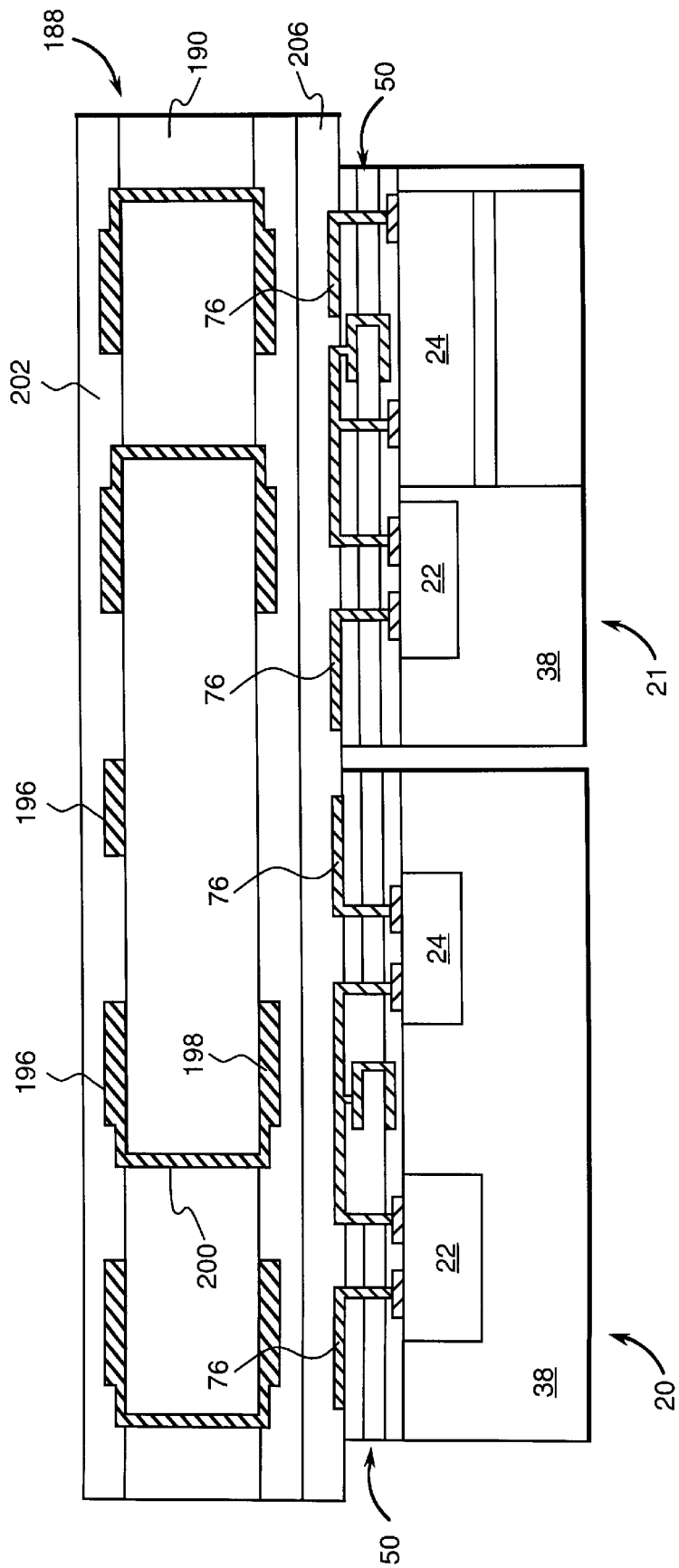
FIG. 7 depicts the assembly of the FIG. 6 dielectric film layer and the FIG. 1 and FIG. 2 submodules.
Figure 8:
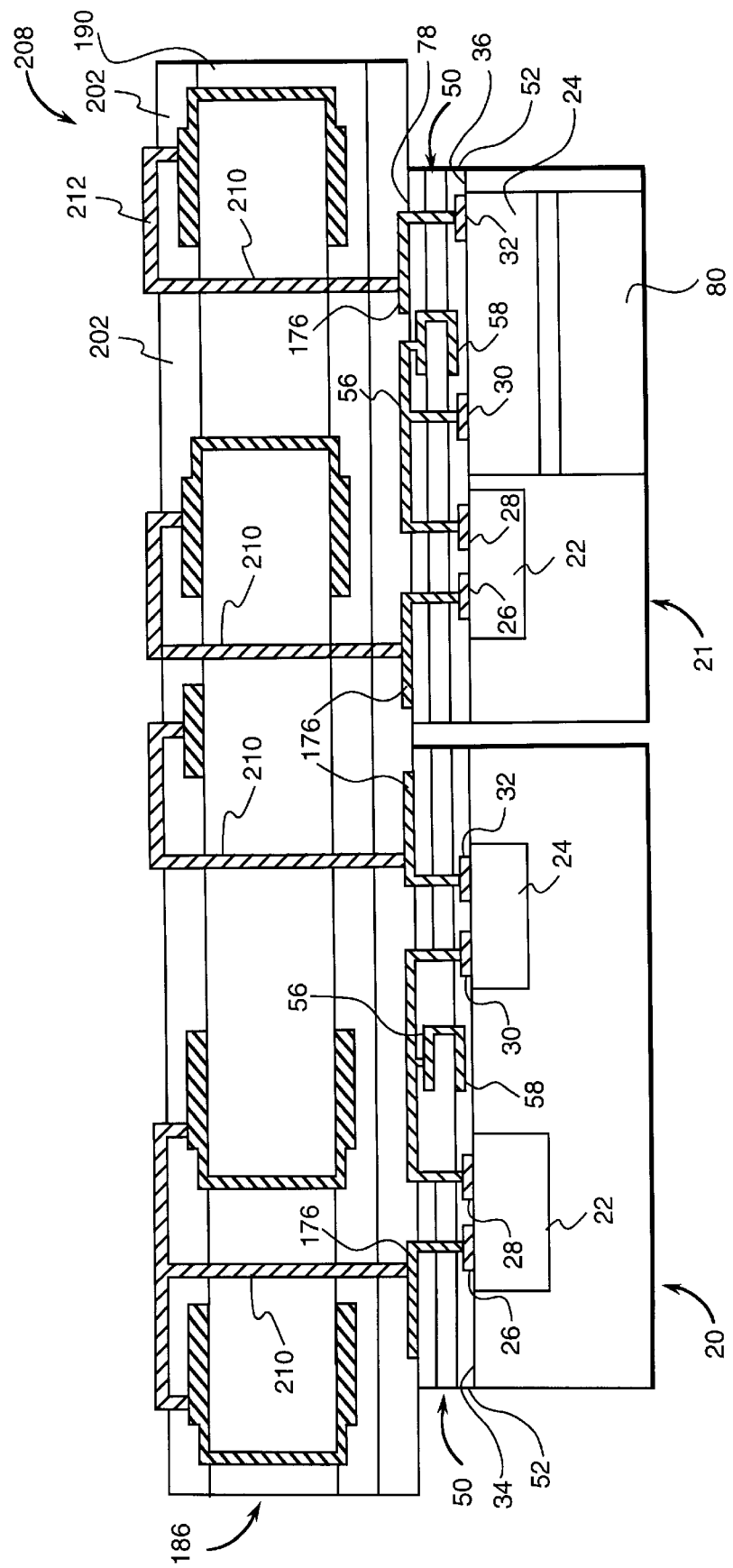
FIG. 8 depicts the final structure after the formation of vias and patterned metallization.

FIG. 7 depicts a final assembly step and FIG. 8 depicts a complex multi-component module 208, where the FIG. 6 interconnect structure 188 is adhered to the FIG. 1 and the FIG. 2 submodules 20 and 21. As shown in FIG. 7, adhesive layer 206 can be used to hold submodules 20 and 21 in place with respect to interconnect structure 188. As shown in FIG. 8, vias 210 are formed through second dielectric cap layer 202 and through at least portions of second dielectric film layer 190 in alignment with respective ones of submodule connection pads 176 and predetermined portions of at least one of the patterned metallization planes 196 and 198. Patterned metallization 212, portions of which extend within vias 210, completes interconnect structure 186, thus providing interconnections between all of individual submodules 20 and 21, as well as providing external connections for the completed structure 208.

In alternative second hierarchial level assembly methods, a prefabricated interconnect structure includes contact pads on the submodule-facing surface, which align with selected ones of the submodule connection pads. The contact pads are electrically connected with solder, conductive adhesive, or with an anisotrophically conductive adhesive. Thus, FIGS. 9–12 depict an alternative method of final assembly, which utilizes solder to assemble submodules 220 and 221 to an interconnect structure 286.

Figure 9:
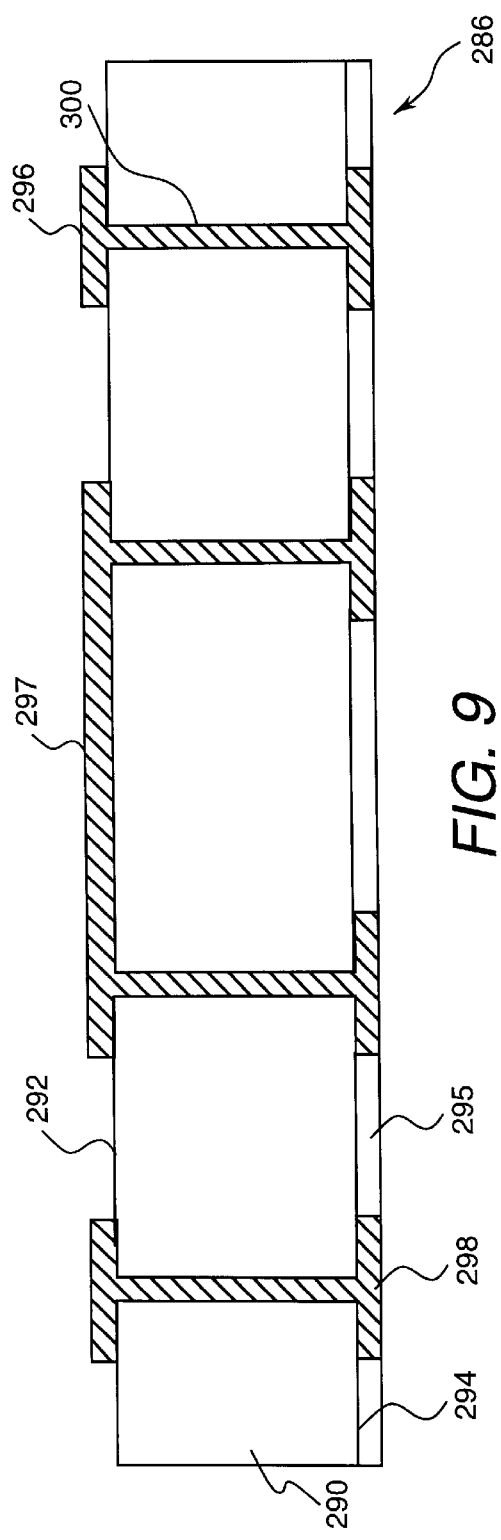
FIGS. 9 through 12 depict a process flow for the second hierarchial assembly level, using solder or an electrically conductive adhesive.

FIG. 9 depicts a multilayer interconnect structure 286, formed on a flexible polymer film 290 having a connection-facing surface 292 and a submodule-facing surface 294 with bottom side passivation 295. Top contact pads 296 as well as top interconnect traces 297 are formed on connection-facing surface 292, and bottom contact pads 298 are formed on submodule-facing surface 294. Vias 300 extend through polymer film 290. Contact pads 298 have a solderable metallurgy such as Ni/Au over Cu/Ti.

Figure 10:
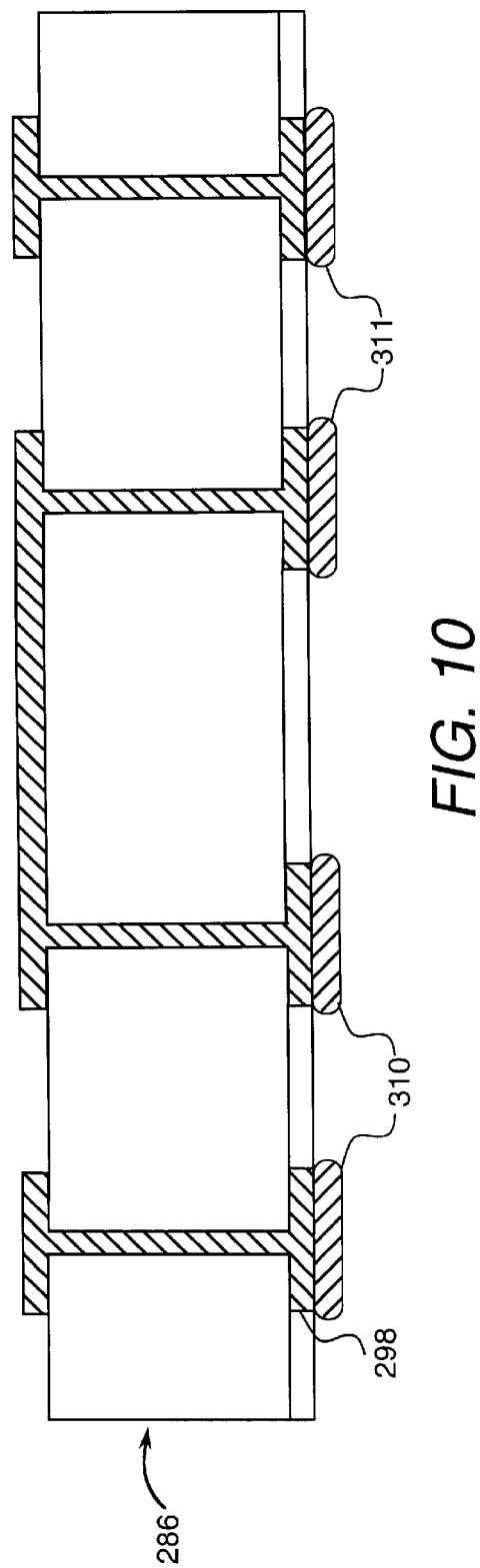

FIG. 10 depicts the interconnect structure 286 of FIG. 9 with solder paste 310 or electrically conductive adhesive 311 dispensed onto contact pads 298. Alternatively, solder 310 can be plated directly onto contact pads 298. In practice, a common connector material (solder or adhesive) will be used for each connection.

Figure 11:
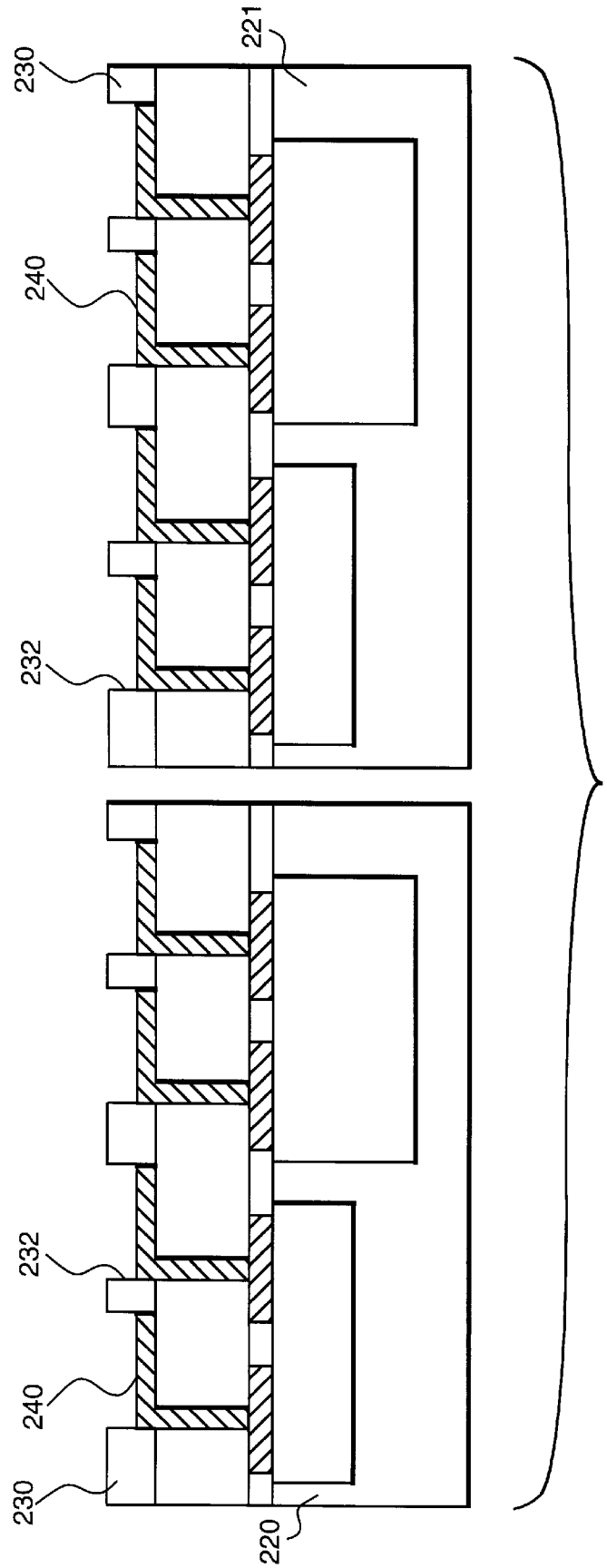

With respect to solder, FIG. 11 depicts two submodules 220 and 221 with submodule connection pads 240 that align to respective bottom contact pads 298 and dispensed solder paste 310 on interconnect structure 286. Submodules 220 and 221 also have a patterned solder masks 230 with openings 232 to expose connection pads 240.

Figure 12:
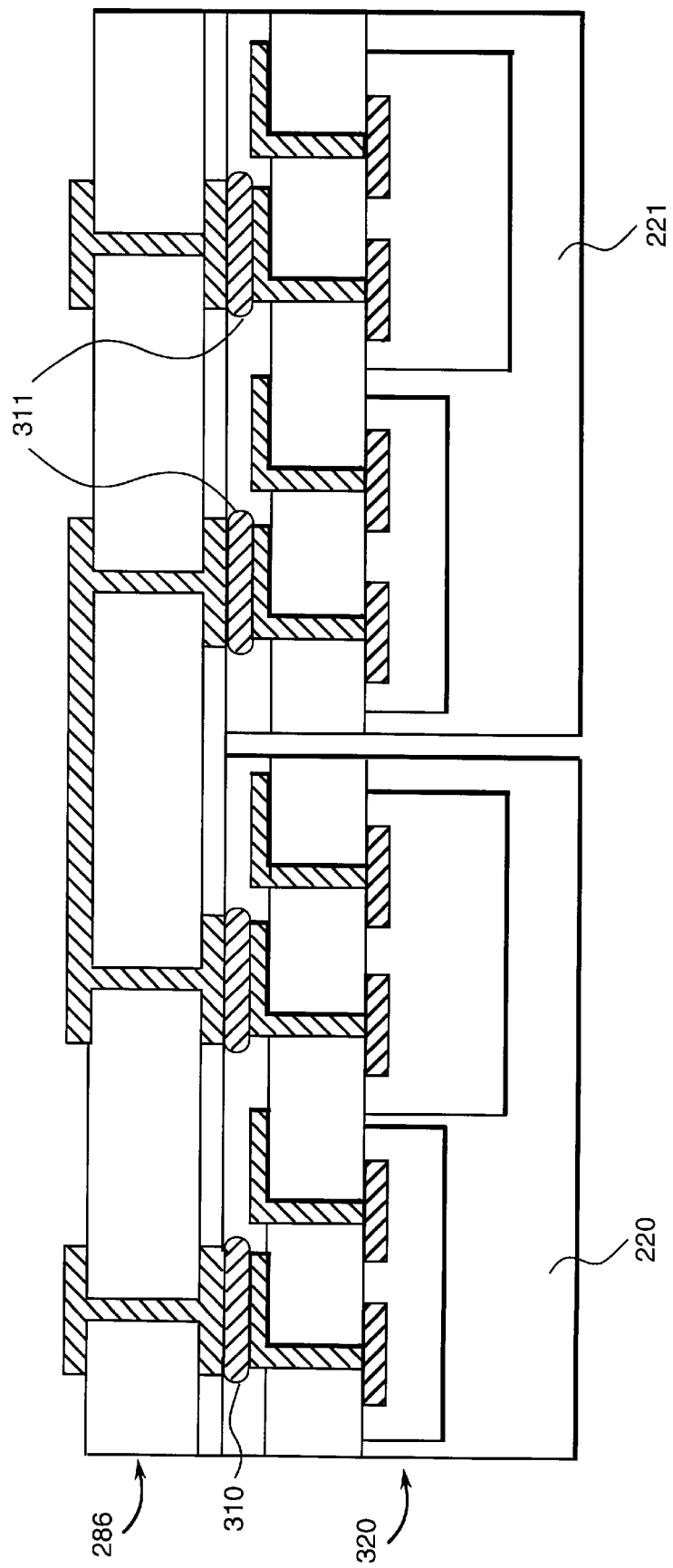

FIG. 12 depicts a completed multi-module assembly 320 following mounting of the submodules 220 and 221 onto interconnect structure 286 and reflowing of solder paste 310 to electrically connect 220 and 221 submodules to interconnect structure 286.

With respect to the electrically conductive adhesive, in an alternative assembly process which also is depicted in the same FIGS. 9–12, the solder 310 is replaced by electrically conductive adhesive 311. Contact pads 298 on the interconnect structure 286 and connection pads 240 on submodules 220 and 221 have a pad metallurgy compatible with conductive adhesive 312. The conductive adhesive (instead of solder 310) is dispensed onto the contact pads 286 of interconnect structure 286. A thermal cure cycle is employed to mechanically and electrically bond submodules 220 and 221 to interconnect structure 286.

FIGS. 13–17 depict another alternative assembly process in which an anisotropically conductive adhesive 312 is used to electrically and mechanically bond submodules 220 and 221 to interconnect structure 286.

FIG. 13 depicts a multilayer interconnect structure 286 formed on a flexible polymer film 290 having a connection-facing surface 292 and a submodule-facing surface 294, with bottom side passivation 295. Top contact pads 296 as well as top interconnect traces 297 are formed on connection-facing surface 292. Bottom contact pads 298 as well as bottom side interconnect trace 299 are formed on submodule-facing surface 294. Contact pads 298 have a metallurgy compatible with conductive adhesive such as Ni/Au over Cu/Ti.

FIG. 14 depicts the interconnect structure 286 of FIG. 13 with a uniform layer of anisotropically conductive adhesive 312 dispensed over submodule-facing surface 294. Anisotripically conductive adhesives can be used to make electrical connections in the Z plane without making electrical connections in the X and Y planes. The thickness preferably ranges from about 6 microns to about 250 microns. The material may comprise any appropriate anisotropically adhesive material. One such material, for example, is available from 3M company as a thermoset-thermoplastic blend filled with nickel coated polymer and sold under the order number 5305R.

Figure 15:
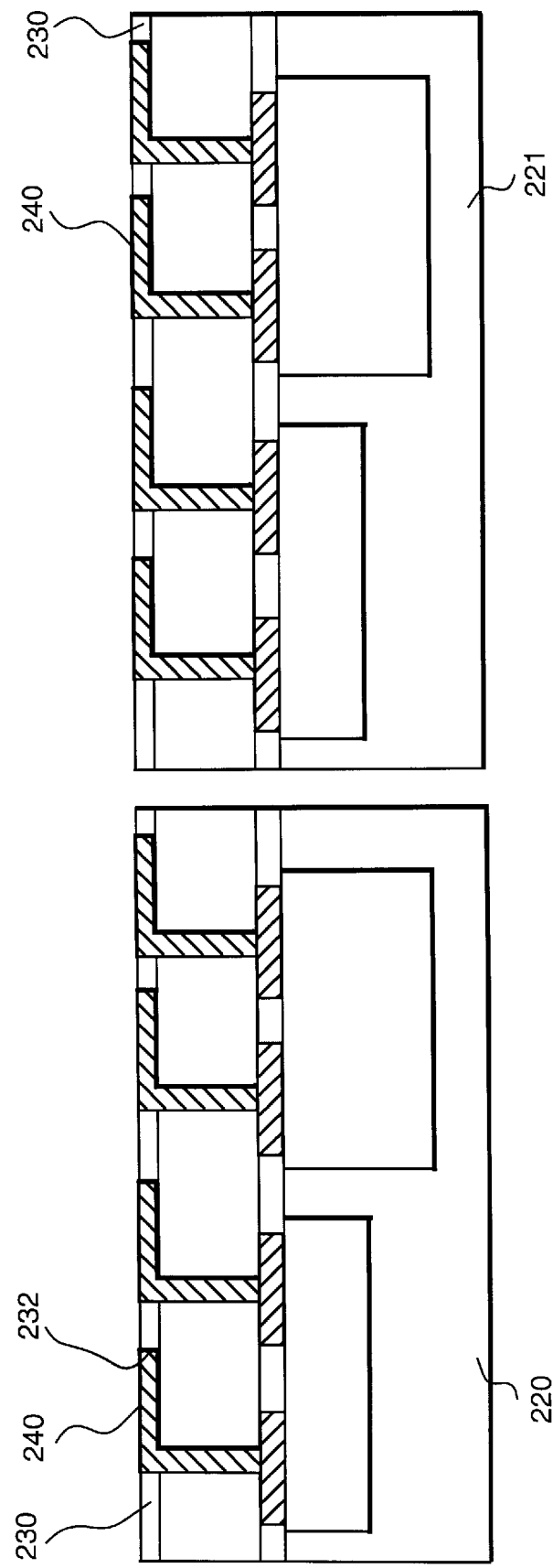

FIG. 15 depicts two submodules 220 and 221 with connection pads 240 that align to respective bottom contact pads 298 on interconnect structure 286. Submodules 220 and 221 also have patterned solder masks 230 with openings 232 to expose the connection pads 240. The solder mask is useful for preventing undesired short circuits in the event that metalization on the interconnect structure overlaps metalization on the submodules in locations where connections are not desired.

Figure 16:
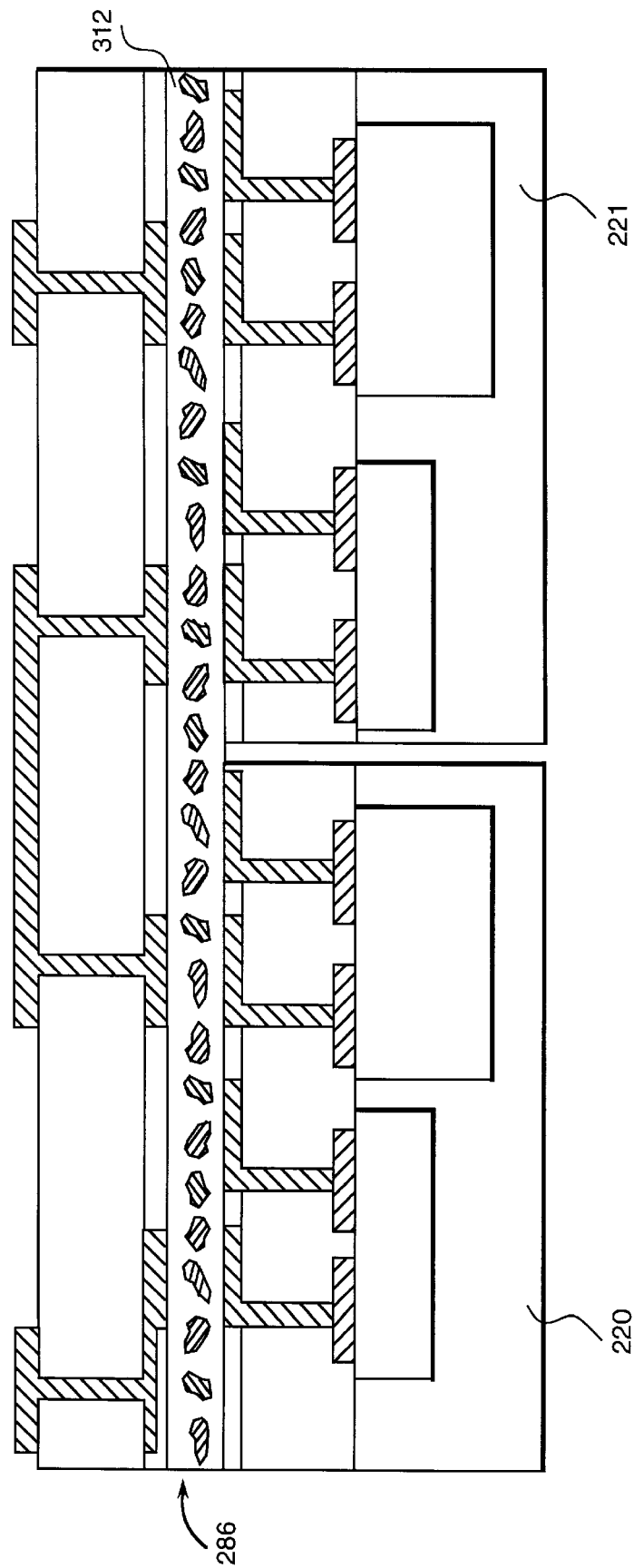

FIG. 16 depicts the two submodules 220 and 221 mounted onto the interconnect structure 286 prior to curing of anisotropically conductive adhesive 312.

Figure 17:
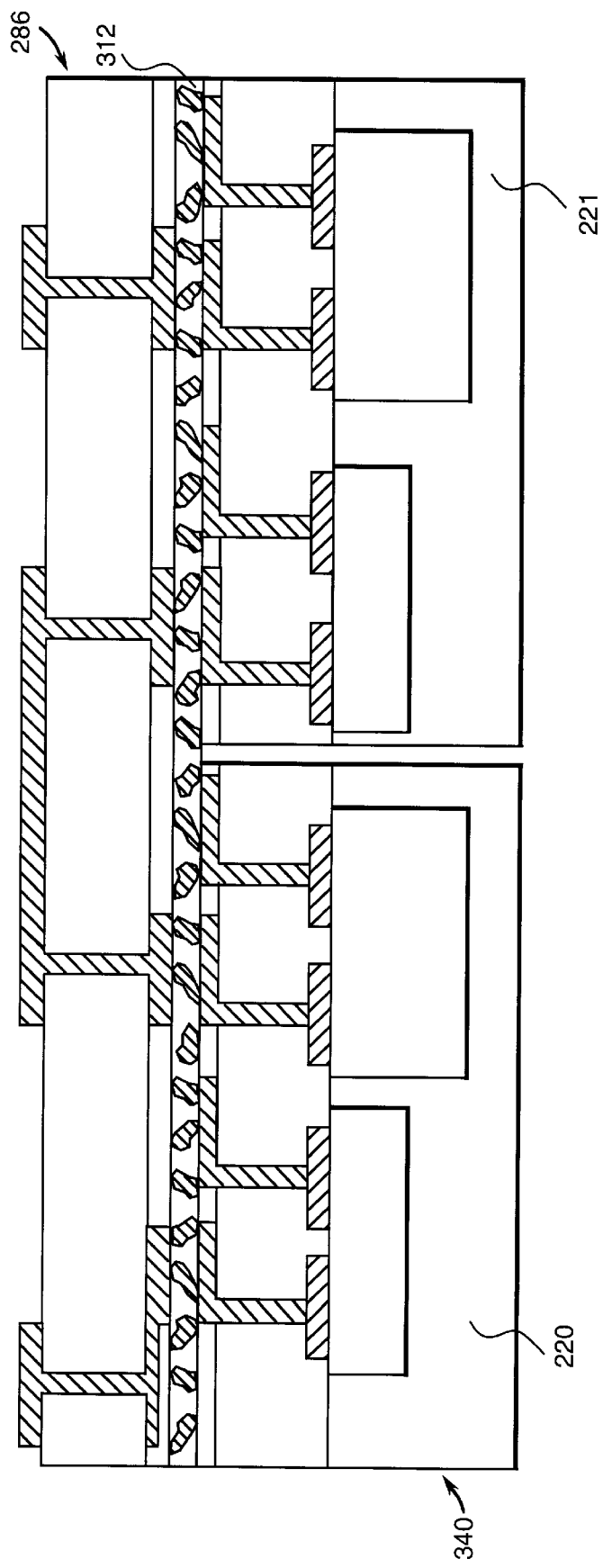

FIG. 17 depicts the completed multi-module assembly 340 containing submodules 220 and 221 mounted onto interconnect structure 286 following curing of anisotropically conductive adhesive 312 to electrically and mechanically connect submodules 220 and 221 interconnect structure 286. Curing can be performed as instructed by the material manufacturer. In one embodiment, curing is performed for about two to five minutes at a temperature ranging from about 160° C. to about 180° C.

Figure 18:
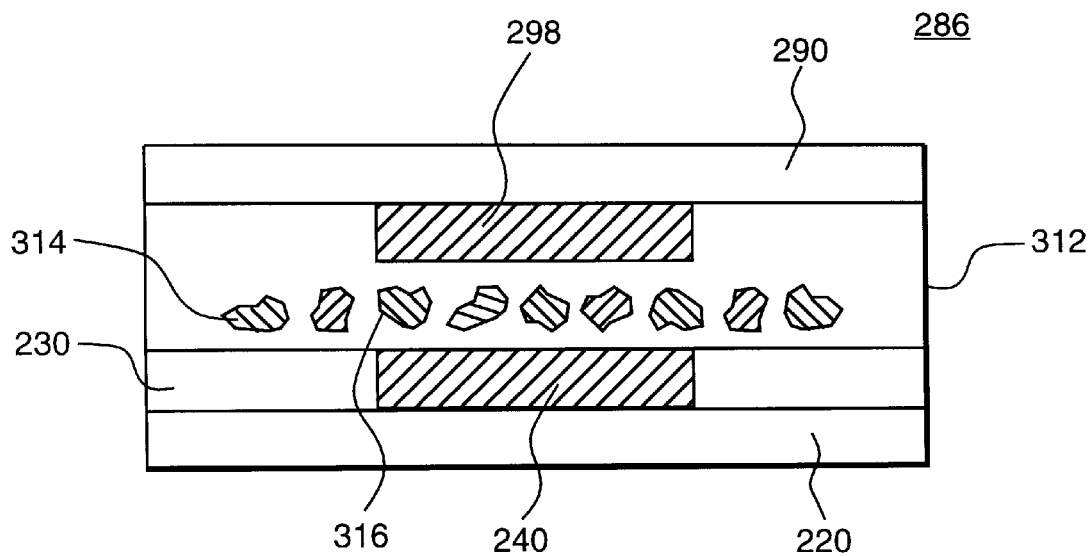
FIGS. 18 and 19 are enlarged and expanded cross-sectional views of an electrical connection using anisotropically conductive adhesive before and after curing of the adhesive.

FIG. 18 is an enlarged and expanded cross-sectional view of contact pad 298 on interconnect structure 286 and submodule connection pad 240 on submodule 220 after mounting submodule 220 to interconnect structure 286 and prior to the curing of anisotropically conductive adhesive 312. In FIG. 18, representative electrically conductive particles 314 and 316 within anisotropically conductive adhesive 312 are not making electrical connection between contact pad 298 and submodule connection pad 240.

Figure 19:
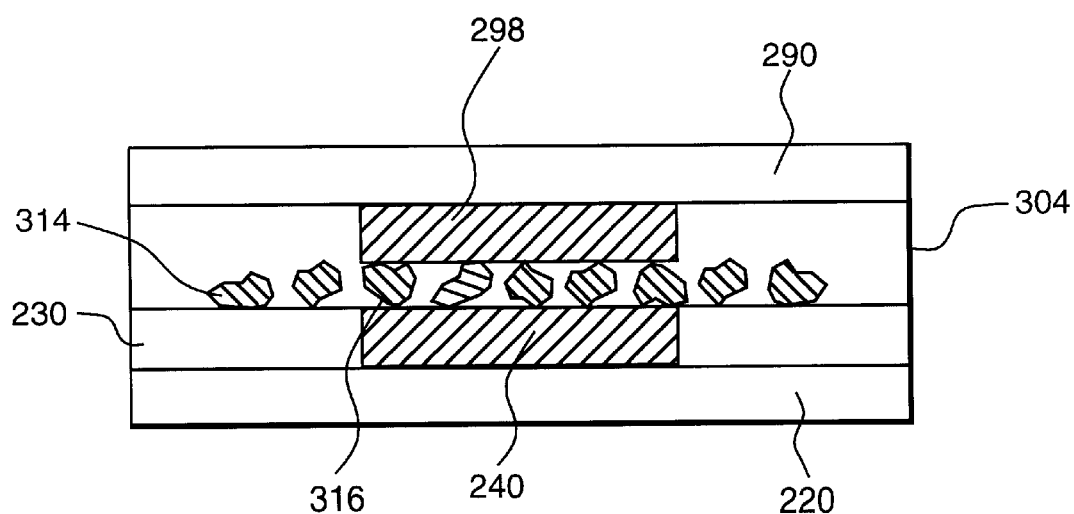

FIG. 19 depicts the same structure as FIG. 18, however following curing of anisotropically conductive adhesive 312. Representative electrically conductive particles 316 are in physical contact with both interconnect structure 286 contact pad 298 as well as submodule 220 submodule connection pad 240 thereby providing electrical connection between pads 298 and 240. Representative electrically conductive particle 314 does not make any electrical connection.

Just as individual components 22 and 24 may be encapsulated within substrate molding material 38 as described hereinabove with reference FIGS. 1 and 2, or placed within a cavity 94 of a preformed substrate 90 as described hereinabove with reference to FIG. 3, submodules 20 and 21 of FIG. 8 (or submodules 220 and 221 of FIGS. 12 and 17) can be encapsulated.

Figure 20:
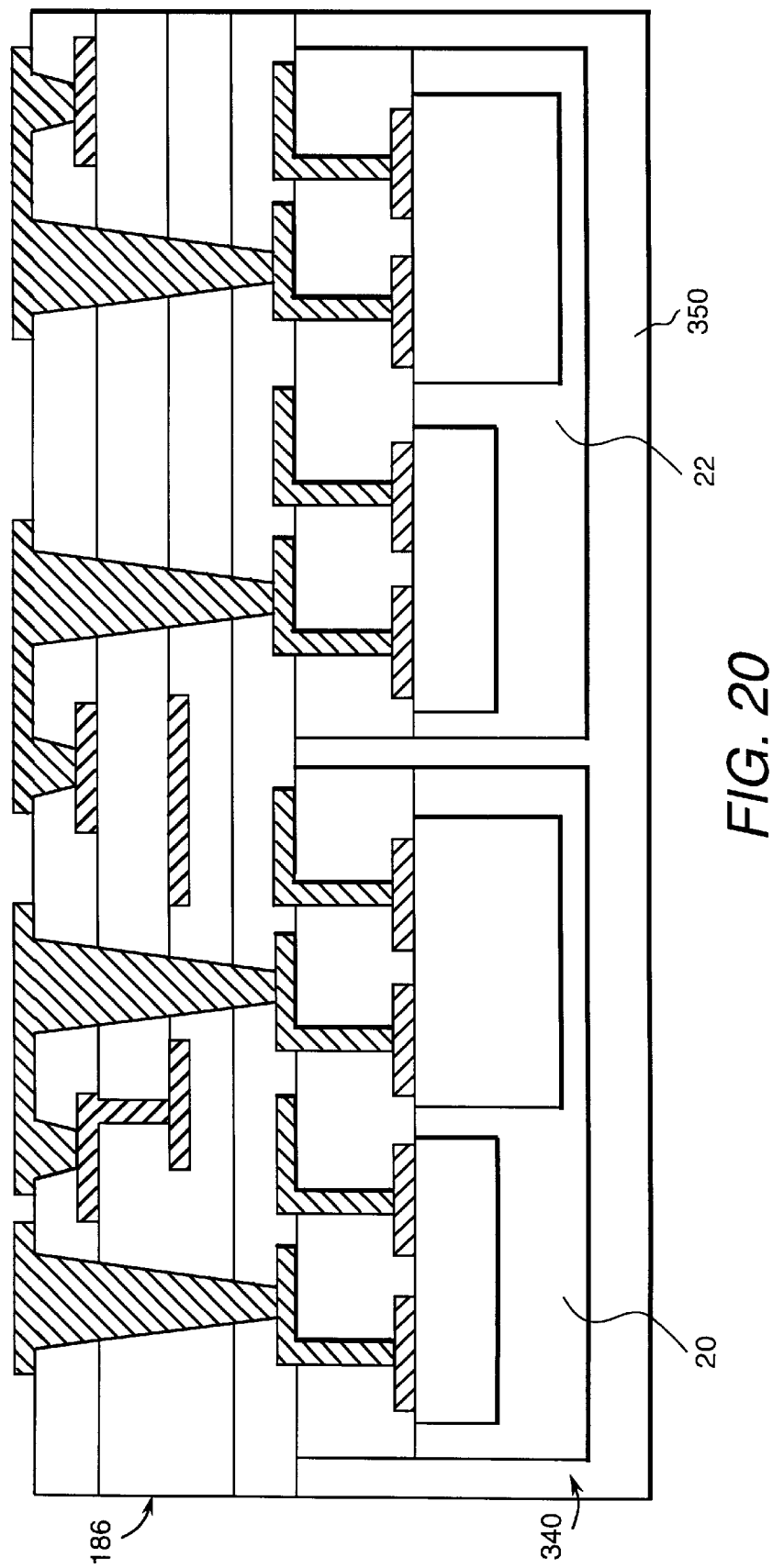
FIG. 20 depicts the formation of a plastic molded substrate on the multi-module assembly of FIG. 8.

In particular, FIG. 20 depicts the formation of a plastic molded substrate structure 350 that encapsulates submodules 22 and 21 and the exposed areas of the back side of interconnect structure 186 of the FIG. 8 complex multi-component module 208.

Figure 21:
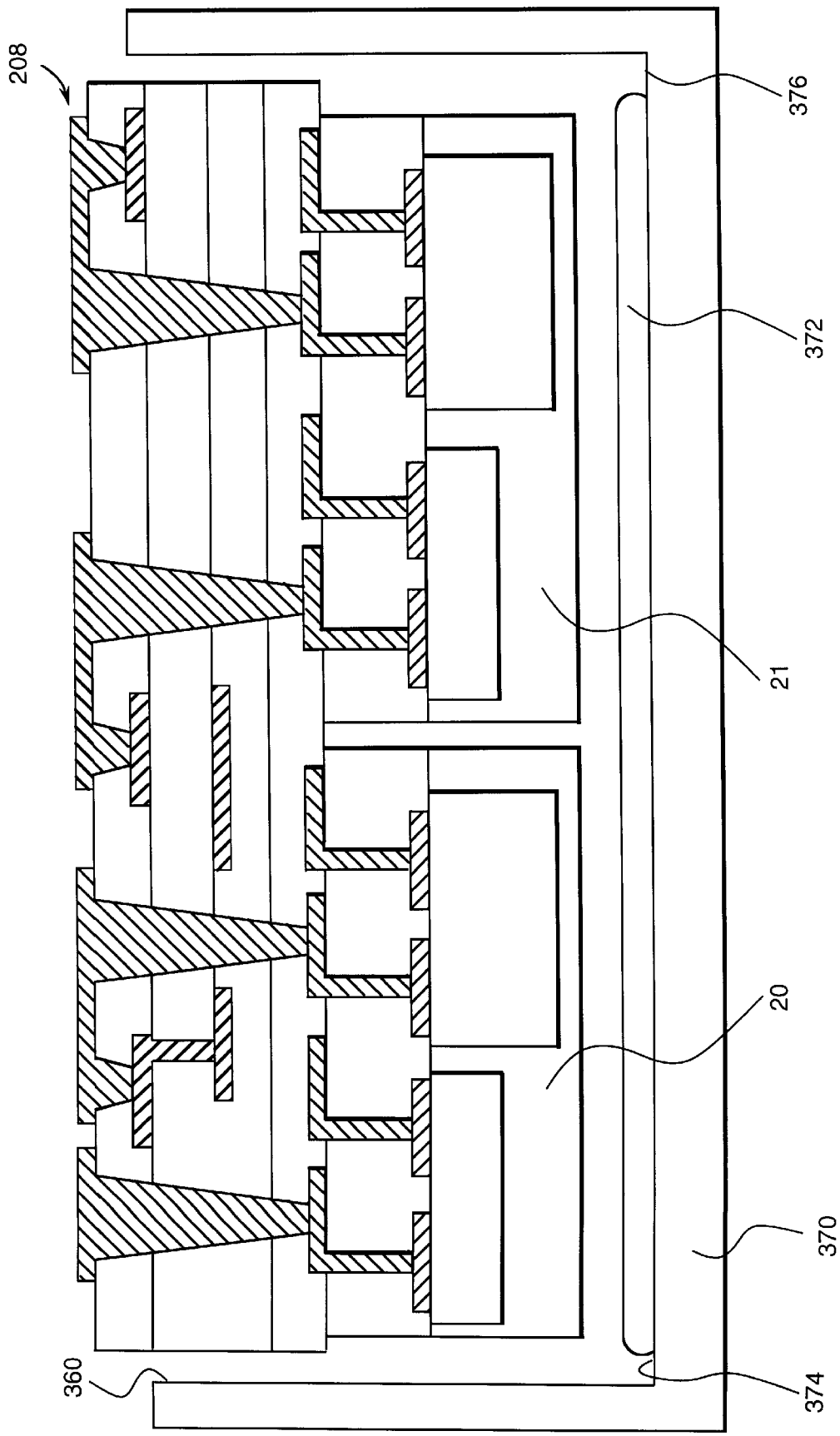
FIGS. 21–23 depict the mounting of the multi-module assembly of FIG. 8 into a cavity formed in an electronic component package or enclosure.
Figure 22:
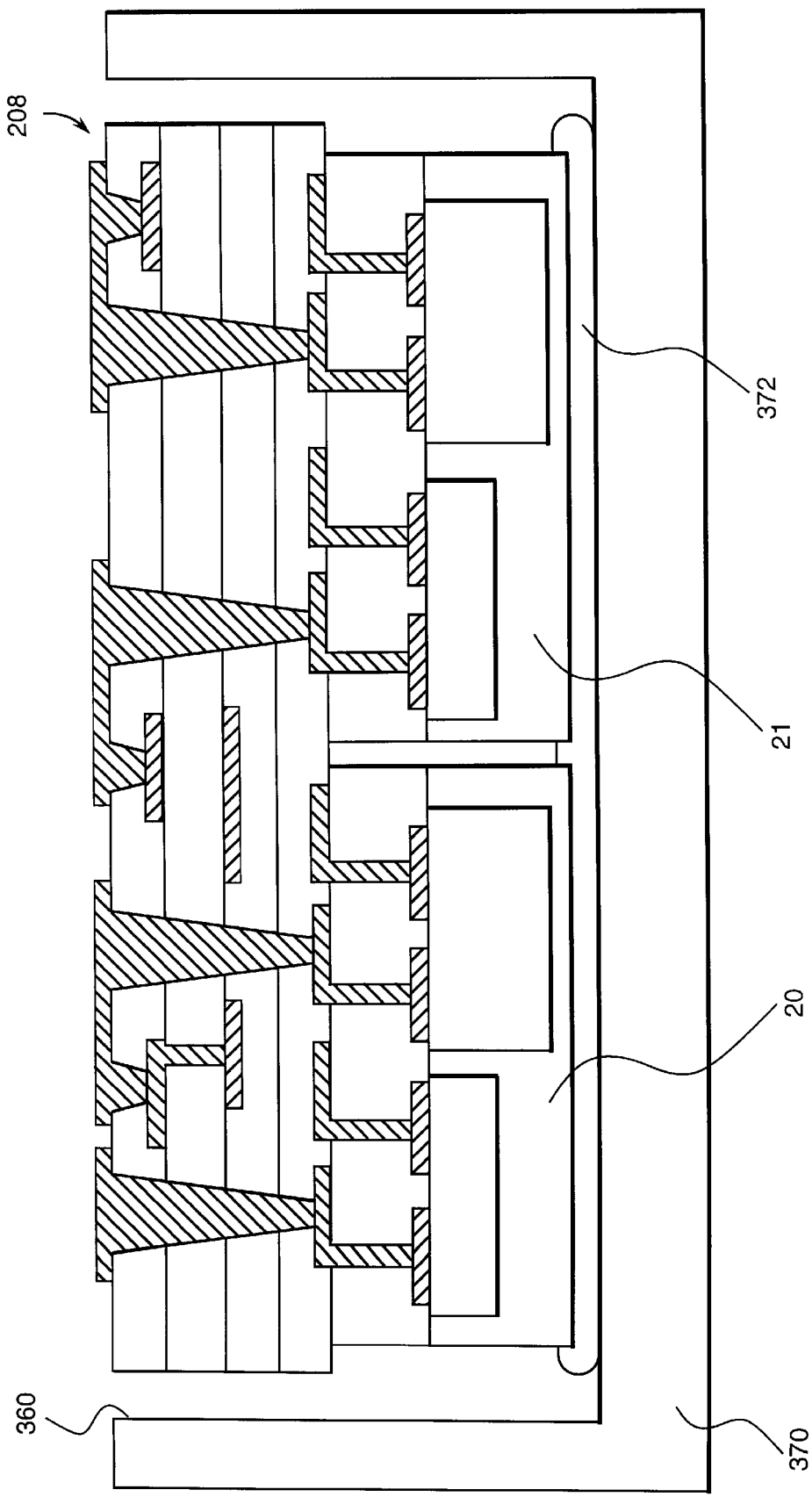
Figure 23:
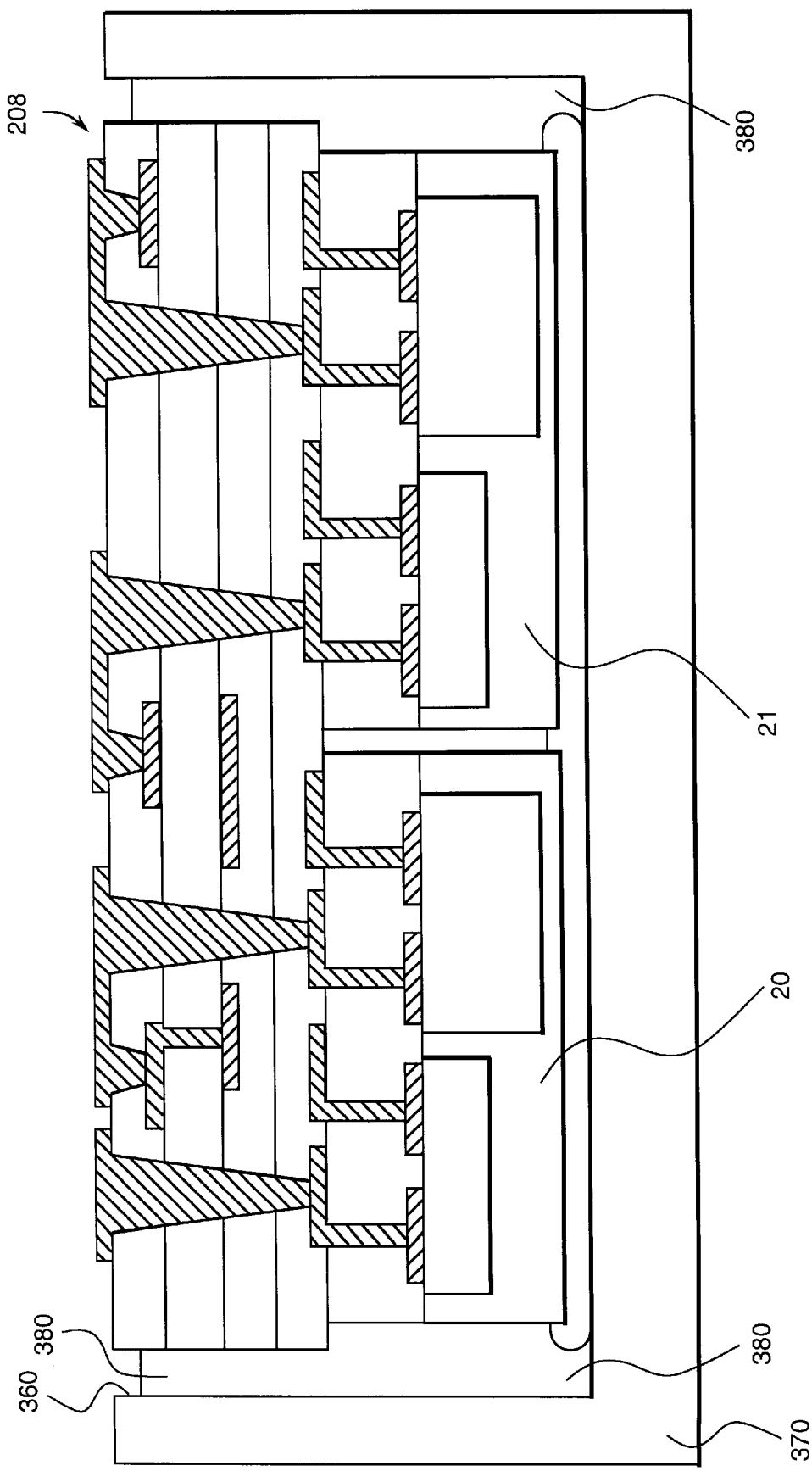

Alternatively, FIGS. 21–23 depict the mounting of the complex multi-component module 208 of FIG. 8 into the cavity 360 of an electronic component package 370 or enclosure 370. FIG. 21 shows the multi-component module 208 and electronic component package 370 with a polymeric adhesive 372 dispensed on portions of the top surface 374 of the package base 376. Although the component package is shown with a cavity 360, the cavity is optional. For example, the component package may comprise a plate without a cavity.

FIG. 22 depicts the multi-component module 208 mounted onto polymeric adhesive 372 on the top surface of package base 376 in electronic component package 370 after curing of adhesive 372.

FIG. 23 depicts an optional step of partially encapsulating the multi-component module 208 within package 370, employing an encapsulant 380, which comprises a substrate molding material.

The processes just described can be extended to a third hierarchical level of assembly, and even higher.

It will appreciated that the hierarchical approach of the invention provides a number of benefits and advantages.

One benefit is that a defective die results in only one submodule building block being scrapped, rather than an entire complex multi-component module. For example, in a design comprising four submodule building blocks with a 5% yield loss per block, the previous monolithic MCM approach would have a 19% module yield loss, while the hierarchical structure of the invention would have no final yield loss (due to die loss), and only 5% module yield loss.

Although the pre-patterned dielectric interconnect structure has excellent interconnect and assembly yield (module yield loss not associated with die yield) very complex modules will have some associated interconnect and/or assembly yield losses. The hierarchical submodule structure of the invention reduces these losses in the same way that module yield loss is due to die yield losses are reduced.

As a third advantage, the previously-disclosed COF structure can offer two layers of interconnect in the prefabricated dielectric film because of tolerance limits of aligning more than one prefabricated dielectric film to another, and the fact that prefabricated dielectric film with more than two interconnect layers is too thick for current COF processing techniques. The use of building block submodules, fabricated with double sided prefabricated dielectric interconnect layer during supermodule assembly provides six layers of interconnection, for prefabricated flexible dielectric film layers and two thin film interconnect layers.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a complex multi-component module, comprising:

fabricating individual submodules each including at least one electronic component with a top surface and component connection pads on the top surface, and a first interconnect structure overlying and bonded to the top surface of the at least one electronic component and interconnecting selected ones of the component connection pads, the first interconnect structure including submodule connection pads on an upper surface; and interconnecting the submodules employing a second interconnect structure overlying and bonded to the upper surfaces of the submodules and interconnecting selected ones of the submodule connection pads.

2. The method of claim 1, wherein fabricating the individual submodules comprises, for at least one submodule, supporting the at least one electronic component on a submodule substrate.

3. The method of claim 1, wherein fabricating the individual submodules includes forming the first interconnect structure as a multilayer interconnect structure with interleaved layers of dielectric material and conductive material.

4. The method of claim 1, wherein interconnecting the submodules includes employing as the second interconnect structure a multilayer interconnect structure with interleaved layers of dielectric material and conductive material.

5. The method of claim 1, which further comprises testing the individual submodules prior to interconnecting the submodules.

6. The method of claim 1, wherein fabricating the individual submodules comprises:

providing as part of the first interconnect structure a dielectric film layer having a connection-facing surface and a substrate-facing surface, with the substrate-facing surface having a patterned conductive material plane thereon including plane openings patterned on the substrate-facing surface;

adhering the dielectric film layer of the first interconnect structure and the at least one component to each other, with the component connection pads located within the openings in the conductive material plane;

forming a plurality of vias extending through at least portions of the dielectric film layer of the first interconnect structure, in alignment with respective ones of the component connection pads and in alignment with predetermined portions of the patterned conductive material plane on the dielectric film layer of the first interconnect structure; and forming patterned conductive material on the dielectric film layer of the first interconnect structure extending through the vias to interconnect selected ones of the component connection pads and selected portions of the patterned conductive material plane on the dielectric film layer, and to define the submodule connection pads.

7. The method of claim 1, wherein fabricating the individual submodules comprises fabricating at least one submodule by:

placing and adhering the at least one component with the component connection pads facing a layer of the first interconnect structure; and employing a substrate molding material to form a submodule substrate.

8. The method of claim 1, wherein fabricating the individual submodules comprises:

providing a substrate having a substrate surface and at least one cavity with a depth corresponding to the thickness of the at least one component;

placing and adhering the at least one component within the cavity face up with the top surface of the at least one component generally coplanar with the substrate surface; and placing and adhering a dielectric film layer of the first interconnect structure on the at least one component and the substrate surface.

9. The method of claim 8, wherein providing a substrate additionally comprises providing an electrically conductive layer extending from the bottom of the cavity to the substrate surface; and wherein placing and adhering the at least one component within the cavity includes employing electrically conductive material to adhere a back side contact on the at least one component to the electrically conductive layer on the bottom of the cavity; and further including forming a plurality of vias extending through at least portions of the dielectric film layer of the first interconnect structure, in alignment with respective ones of the component connection pads and at least one via in alignment with the electrically conductive layer on the substrate surface; and forming patterned conductive material on the dielectric film layer of the first interconnect structure extending through the vias to interconnect selected ones of the component connection pads, and to form an interconnection to the electrically conductive layer on the substrate surface.

10. The method of claim 1, wherein fabricating the individual submodules comprises:

providing as part of the first interconnect structure a prefabricated flexible interconnect structure including a dielectric film layer having a connection-facing surface and a substrate-facing surface, with each of the surfaces of the dielectric film layer of the first interconnect structure having a respective patterned conductive material plane thereon including plane openings patterned on each of the surfaces of the dielectric film layer, and including a dielectric cap layer over the connection-facing surface of the dielectric film layer and the patterned conductive material plane thereon;

adhering the prefabricated flexible interconnect structure of the first interconnect structure and the at least one component to each other, with component connection pads located within the openings in the conductive material plane on the substrate-facing surface;

forming a plurality of vias extending through the dielectric cap layer and through at least portions of the dielectric film layer of the first interconnect structure, in alignment with respective ones of the component connection pads and in alignment with predetermined portions of at least one of the patterned conductive material planes on the dielectric film layer; and forming patterned conductive material on the dielectric cap layer extending through the vias to interconnect selected ones of the component connection pads and selected portions of at least one of the patterned conductive material planes on the dielectric film layer of the first interconnect structure, and to define the submodule connection pads on the dielectric cap layer.

11. The method of claim 1, wherein fabricating the individual submodules comprises:

providing as part of the first interconnect structure a prefabricated flexible interconnect structure including a dielectric film layer having a connection-facing surface and a substrate-facing surface, with each of the surfaces of the dielectric film layer of the first interconnect structure having a respective patterned conductive material plane thereon including plane openings patterned on each of the surfaces of the dielectric film layer;

adhering the prefabricated flexible interconnect structure of the first interconnect structure and the at least one component to each other, with component connection pads located within the openings in the conductive material plane on the substrate-facing surface;

providing a dielectric cap layer over the connection-facing surface of the dielectric film layer of the first interconnect structure and the patterned conductive material plane thereon;

forming a plurality of vias extending through the dielectric cap layer and through at least portions of the dielectric film layer of the first interconnect structure, in alignment with respective ones of the component connection pads and in alignment with predetermined portions of at least one of the patterned conductive material planes on the dielectric film layer; and forming patterned conductive material on the dielectric cap layer extending through the vias to interconnect selected ones of the component connection pads and selected portions of at least one of the patterned conductive material planes on the dielectric film layer of the first interconnect structure, and to define the submodule connection pads on the dielectric cap layer.

12. The method of claim 1, wherein interconnecting the submodules comprises:

providing as part of the second interconnect structure a dielectric film layer having a connection-facing surface and a submodule-facing surface, with the submodule-facing surface having a patterned conductive material plane thereon including plane openings patterned on the submodule-facing surface;

adhering the dielectric film layer of the second interconnect structure to the submodules over the upper surfaces and the submodule connection pads, with the submodule connection pads located within the openings in the conductive material plane on the submodule-facing surface;

forming a plurality of vias extending through at least portions of the dielectric film layer of the second interconnect structure, in alignment with respective ones of the submodule connection pads and predetermined portions the patterned conductive material plane on the dielectric film layer of the second interconnect structure; and forming patterned conductive material on the dielectric film layer of the second interconnect structure extending through the vias to interconnect selected ones of the submodule connection pads and selected portions of the patterned conductive material plane on the dielectric film layer of the second interconnect structure.

13. The method of claim 1, wherein interconnecting the submodules comprises:

providing as part of the second interconnect structure a prefabricated flexible interconnect structure including a dielectric film layer having a connection-facing surface and a submodule-facing surface, with each of the surfaces of the dielectric film layer of the second interconnect structure having a respective patterned conductive material plane thereon including plane openings patterned on each of the surfaces of the dielectric film layer, and including a dielectric cap layer over the connection-facing surface of the dielectric film layer of the second interconnect structure and the patterned conductive material plane thereon;

adhering the prefabricated flexible interconnect structure of the second interconnect structure to the submodules over the upper surfaces and the submodule connection pads , with the submodule connection pads located within the openings in the conductive material plane on the submodule-facing surface;

forming a plurality of vias extending through the dielectric cap layer and through at least portions of the dielectric film layer of the second interconnect structure, in alignment with respective ones of the submodule connection pads and predetermined portions of at least one of the patterned conductive material planes on the dielectric film layer of the second interconnect structure; and forming patterned conductive material on the dielectric cap layer of the second interconnect structure extending through the vias to interconnect selected ones of the submodule connection pads and selected portions of at least one of the patterned conductive material planes on the dielectric film layer of the second interconnect structure.

14. The method of claim 1, wherein interconnecting the submodules comprises:

providing as part of the second interconnect structure a prefabricated flexible interconnect structure including a dielectric film layer having a connection-facing surface and a submodule-facing surface, with each of the surfaces of the dielectric film layer of the second interconnect structure having a respective patterned conductive material plane thereon including plane openings patterned on each of the surfaces of the dielectric film layer;

adhering the prefabricated flexible interconnect structure of the second interconnect structure to the submodules over the upper surfaces and the submodule connection pads, with the submodule connection pads located within the openings in the conductive material plane on the submodule-facing surface;

providing a dielectric cap layer over the connection-facing surface of the dielectric film layer of the second interconnect structure and the patterned conductive material plane thereon;

forming a plurality of vias extending through the dielectric cap layer and through at least portions of the dielectric film layer of the second interconnect structure, in alignment with respective ones of the submodule connection pads and predetermined portions of at least one of the patterned conductive material planes on the dielectric film layer of the second interconnect structure; and forming patterned conductive material on the dielectric cap layer of the second interconnect structure extending through the vias to interconnect selected ones of the submodule connection pads and selected portions of at least one of the patterned conductive material planes on the dielectric film layer of the second interconnect structure.

15. The method of claim 1, wherein interconnecting the submodules comprises:

providing as part of the second interconnect structure a flexible interconnect structure including a dielectric film layer having a connection-facing surface and a submodule-facing surface, and including contact pads on the submodule-facing surface which align with selected ones of the submodule connection pads; and interconnecting the contact pads with the selected ones of the submodule connection pads.

16. The method of claim 15, wherein interconnecting the contact pads with the selected ones of the submodule connection pads comprises employing a solder.

17. The method of claim 15, wherein interconnecting the contact pads with the selected ones of the submodule connection pads comprises employing an electrically conductive polymer adhesive.

18. The method of claim 15, wherein interconnecting the contact pads with the selected ones of the submodule connection pads comprises employing an anisotropic electrically conductive adhesive to bond the submodules to the submodule-facing surface of the dielectric film layer of the second interconnect structure.

19. The method of claim 1, which further comprises employing an adhesive material to mount the complex multi-component module to a plate.

20. The method of claim 1, which further comprises employing an adhesive material to mount the complex multi-component module into an electronic component package.

21. The method of claim 1, which further comprises employing a substrate molding material to encapsulate the submodules and exposed areas of the side of the second interconnect structure which is bonded to the upper surfaces of the submodules.

22. A complex multi-component module comprising:

a plurality of individual submodules, each submodule including at least one electronic component including a top surface and component connection pads on the top surface; and a first interconnect structure overlying and bonded to the top surface of the at least one electronic component and interconnecting selected ones of the component connection pads, the first interconnect structure including submodule connection pads on an upper surface; and a second interconnect structure overlying and bonded to the upper surfaces of the submodules and interconnecting selected ones of the submodule connection pads.

23. The module of claim 22, wherein at least one submodule includes a submodule substrate supporting the at least one electronic component.

24. The module of claim 23, wherein the submodule substrate comprises hardened substrate molding material surrounding the at least one electronic component except for the top surface.

25. The module of claim 23, wherein the submodule substrate comprises a preformed body including a component cavity receiving the at least one component.

26. The module of claim 22, wherein the first interconnect structure comprises interleaved layers of dielectric material and conductive material.

27. The module of claim 26, wherein the second interconnect structure comprises interleaved layers of dielectric material and conductive material.

28. The module of claim 22, wherein within each of the individual submodules the first interconnect structure comprises:

a dielectric film layer having a connection-facing surface and a substrate-facing surface, with the substrate-facing surface having a patterned conductive material plane thereon including plane openings patterned on the substrate-facing surface;

the dielectric film layer being adhered to the at least one component with the component connection pads located within the openings in the patterned conductive material plane;

a plurality of vias extending through at least portions of the dielectric film layer of the first interconnect structure, in alignment with respective ones of the component connection pads and in alignment with predetermined portions of the patterned conductive material plane on the dielectric film layer of the first interconnect structure; and patterned conductive material on the dielectric film layer of the first interconnect structure extending through the vias to interconnect selected ones of the component connection pads and selected portions of the patterned conductive material plane on the dielectric film layer, and to define the submodule connection pads.

29. The module of claim 28, wherein at least one submodule includes a submodule substrate supporting the at least one electronic component and comprising hardened substrate molding material surrounding the at least one electronic component except for the top surface.

30. The module of claim 28, wherein at least one submodule includes a submodule substrate supporting the at least one electronic component, the substrate having a substrate surface and at least one cavity with a depth corresponding to the thickness of the at least one component, the at least one component being adhered within the cavity face up with the top surface of the component generally coplanar with the substrate surface.

31. The module of claim 30, wherein:
the substrate includes an electrically conductive layer extending from the bottom of the cavity to the substrate surface;
the at least one component includes a back side contact adhered to the electrically conductive layer within the cavity by an electrically conductive material;
the plurality of vias includes at least one via extending to and in alignment with the electrically conductive layer on the substrate surface.

32. The module of claim 22, wherein within each of the individual submodules the first interconnect structure comprises:
a dielectric film layer having a connection-facing surface and a substrate-facing surface, with each of the surfaces of the dielectric film layer of the first interconnect structure having a respective patterned conductive material plane thereon including plane openings patterned on each of the surfaces of the dielectric film layer;
a dielectric cap layer over the connection-facing surface of the dielectric film layer and the patterned conductive material plane thereon;
the dielectric film layer being adhered to the at least one component, with the component connection pads located within the openings in the conductive material plane on the substrate-facing surface;
a plurality of vias extending through the dielectric cap layer and through at least portions of the dielectric cap layer and through at least portions of the dielectric film layer of the first interconnect structure, in alignment with respective ones of the component connection pads and in alignment with predetermined portions of at least one of the patterned conductive material planes on the dielectric film layer; and
patterned conductive material on the dielectric cap layer extending through the vias to interconnect selected ones of the component connection pads and selected portions of at least one of the patterned conductive material planes on the dielectric film layer of the first interconnect structure, and to define the submodule connection pads on the dielectric cap layer.

33. The module of claim 22, wherein the second interconnect structure comprises:
a dielectric film layer having a connection-facing surface and a submodule-facing surface , with the submodule-facing surface having a patterned conductive material plane thereon including plane openings patterned on the submodule-facing surface;
the dielectric film layer being adhered to the submodules over the upper surfaces and the submodule connection pads, with the submodule connection pads located within the openings in the conductive material plane on the submodule-facing surface;
a plurality of vias extending through at least portions of the dielectric film layer of the second interconnect structure, in alignment with respective ones of the submodule connection pads and predetermined portions the patterned conductive material plane on the dielectric film layer of the second interconnect structure; and
patterned conductive material on the dielectric film layer of the second interconnect structure extending through the vias to interconnect selected ones of the submodule connection pads and selected portions of the patterned conductive material plane on the dielectric film layer of the second interconnect structure.

34. The module of claim 22, wherein the second interconnect structure comprises:
a dielectric film layer having a connection-facing surface and a submodule-facing surface, with each of the surfaces of the dielectric film layer of the second interconnect structure having a respective patterned conductive material plane thereon including plane openings patterned on each of the surfaces of the dielectric film layer;
a dielectric cap layer over the connection-facing surface of the dielectric film layer of the second interconnect structure and the patterned conductive material plane thereon;
the dielectric film layer of the second interconnect structure being adhered to the submodules over the upper surfaces and the submodule connection pads, with the submodule connection pads located within the openings in the conductive material plane on the submodule-facing surface;
a plurality of vias extending through the dielectric cap layer and through at least portions of the dielectric film layer of the interconnect structure, in alignment with respective ones of the submodule connection pads and predetermined portions of at least one of the patterned conductive material planes on the dielectric film layer of the second interconnect structure; and
patterned conductive material on the dielectric cap layer of the second interconnect structure extending through the vias to interconnect selected ones of the submodule connection pads and selected portions of at least one of the patterned conductive material planes on the dielectric film layer of the second interconnect structure.

35. The module of claim 22, wherein
the second interconnect structure comprises a dielectric film layer having a connection-facing surface and a submodule-facing surface, and including contact pads on the submodule-facing surface which align with selected ones of the submodule connection pads; and which further comprises
interconnections between the contact pads and selected ones of the submodule connection pads.

36. The module of claim 35, wherein the interconnections comprise solder.

37. The module of claim 35, wherein the interconnections comprise an electrically conductive polymer adhesive.

38. The module of claim 35, wherein the interconnections comprise an anisotropic electrically conductive adhesive.

39. The module of claim 22, which further comprises a plate underlying the submodules.

40. The module of claim 22, which further comprises an electronic component package into which the submodules are mounted.

41. The module of claim 22, which further comprises plastic molding compound encapsulating the submodules and exposed areas of the side of the second interconnect structure which is bonded to the upper surfaces of the submodules.

* * * * *

UNITED STATES PATENT AND TRADEMARK OFFICE
CERTIFICATE OF CORRECTION

PATENT NO. : 6,239,980 B1
DATED : May 29, 2001
INVENTOR(S) : Fillion et al.

It is certified that error appears in the above-identified patent and that said Letters Patent is hereby corrected as shown below:

<u>Title page,</u>
Item [75], Inventors, please delete "Rob Ert John Wojnarowski" and insert -- Robert John Wojnarowski, -- therefor Signed and Sealed this Thirtieth Day of March, 2004

JON W. DUDAS
*Acting Director of the United States Patent and Trademark Office*